United States Patent
Hayano et al.

(10) Patent No.: US 6,548,312 B1
(45) Date of Patent: Apr. 15, 2003

(54) MANUFACTURING METHOD OF SEMICONDUCTOR INTEGRATED CIRCUIT DEVICES AND MASK MANUFACTURING METHODS

(75) Inventors: Katsuya Hayano, Ome (JP); Norio Hasegawa, Nishitama (JP); Akira Imai, Hachiouji (JP); Naoko Asai, Higashimurayama (JP); Eiji Tsujimoto, Ome (JP); Takahiro Watanabe, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/640,721

(22) Filed: Aug. 18, 2000

(30) Foreign Application Priority Data

Aug. 27, 1999 (JP) ............................................. 11-242136

(51) Int. Cl.$^7$ .......................... H01L 21/00; G01R 31/26
(52) U.S. Cl. ............................... 438/5; 438/8; 438/14; 438/16; 438/17; 438/18; 430/5; 430/22; 430/394; 716/4; 716/15; 716/19; 716/20; 716/21
(58) Field of Search ........................... 438/5, 8, 14, 16, 438/17, 18; 430/5, 311, 312, 313, 394, 22, 30; 716/19, 15, 4, 20, 21

(56) References Cited

U.S. PATENT DOCUMENTS

| | | | | |
|---|---|---|---|---|
| 5,526,094 A | * | 6/1996 | Noguchi et al. | 355/53 |
| 5,546,225 A | * | 8/1996 | Shiraishi | 359/559 |
| 5,631,110 A | * | 5/1997 | Shioiri et al. | 430/5 |
| 5,717,449 A | | 2/1998 | Luque | 347/55 |
| 6,020,109 A | * | 2/2000 | Okamoto et al. | 430/311 |
| 6,225,637 B1 | * | 5/2001 | Terashima et al. | 250/490.2 |
| 6,249,597 B1 | * | 6/2001 | Tsudaka | 382/144 |

FOREIGN PATENT DOCUMENTS

| | | |
|---|---|---|
| JP | 3-215861 | 9/1991 |
| JP | 9-30028 | 2/1997 |
| JP | 10-321685 | 4/1998 |
| JP | 10-288567 | 10/1998 |

OTHER PUBLICATIONS

"Extended Abstracts" (the 46th Meeting) Japan Society of Applied Physics and Related Societies, 28–YB–10, p. 739 (second literature).

* cited by examiner

Primary Examiner—Matthew Smith
Assistant Examiner—Igwe Anya
(74) Attorney, Agent, or Firm—Miles & Stockbridge P.C.

(57) ABSTRACT

In order to inhibit or prevent a pattern abnormality such as the deformation or misalignment of a pattern of a semiconductor integrated circuit device, a light intensity is calculated based on the pattern data DBP of a mask and the aberration data DBL of a lens of a pattern exposure device (step 101) and then the results of the light intensity calculation is compared with the results of the light intensity calculated on condition that the lens of the pattern exposure device has no aberration (step 102), and then a pattern data exceeding an allowable level, of the pattern data of the mask, is corrected according to the amount of correction calculated on the basis of the results of the comparison such that the pattern data does not exceed the allowable level (step 104). The mask is manufactured by using the mask making data DBM after the correction and then is mounted on the pattern exposure device to transfer a predetermined pattern to a semiconductor wafer.

31 Claims, 18 Drawing Sheets

FIG. 14

| SYMMETRIC | cos θ | sin θ | cos 2θ | sin 2θ | cos 3θ | sin 3θ | cos 4θ | sin 4θ | cos 5θ | sin 5θ |
|---|---|---|---|---|---|---|---|---|---|---|
| Z1 | | | | | | | | | | |
| Z4 | Z2 | Z3 | | | | | | | | |
| Z9 | Z7 | Z8 | Z5 | Z6 | | | | | | |
| Z16 | Z14 | Z15 | Z12 | Z13 | Z10 | Z11 | | | | |
| Z25 | Z23 | Z24 | Z21 | Z22 | Z19 | Z20 | Z17 | Z18 | | |
| Z36 | Z34 | Z35 | Z32 | Z33 | Z30 | Z31 | Z28 | Z29 | Z26 | Z27 |

MANUFACTURING METHOD OF SEMICONDUCTOR INTEGRATED CIRCUIT DEVICES AND MASK MANUFACTURING METHODS

BACKGROUND OF THE INVENTION

The present invention relates to a method of manufacturing a semiconductor integrated circuit device and a method of manufacturing a mask and, in particular, to a technology effectively applied to a pattern exposure device for transferring a predetermined pattern to a semiconductor wafer.

DESCRIPTION OF THE RELATED ART

The micromachining of the element, the wiring and the like of a semiconductor device has been accomplished by the increasing performance of a demagnification projection aligner used in a manufacturing process (lithography process) of the semiconductor device. However, as the micromachining of a pattern such as the element or the wiring rapidly progresses, the effect which the lens aberration of the demagnification projection aligner has on the pattern increases and hence, to further progress the micromachining of the pattern, the aberration of the lens needs to be reduced.

An evaluation technology of the lens aberration is disclosed in, for example, Japanese Patent Laid-Open No. 10-288567 or Japanese Patent Laid-Open No. 9-30028: that is, a technology of evaluating the lens aberration of a demagnification projection aligner by subjecting a photoresist film to an exposure processing and a development processing by using a photomask which produces a phase difference of 180 degrees between light passing through a semi-transparent portion of a mask substrate and light passing through a transparent portion thereof and then by observing a transferred pattern by a second light intensity peak generated in the vicinity of the pattern to which the transparent portion is transferred is disclosed. Also, in order to solve the problems of deformation of the pattern caused by the lens aberration, in Japanese Patent Laid-Open No. 3-215861 is disclosed a technology of comparing a pattern actually transferred to a photoresist film by using a mask with a design pattern (a pattern formed on the mask) and of correcting the pattern of the mask if there exists a pattern exceeding an allowable amount of deformation.

However, the present inventor found that the above technology had the following problems.

That is, since the required pattern size has been reduced to almost the limit of the pattern size capable of being formed by a demagnification projection aligner today, it is a reality that the above reduction in the lens aberration can not respond to the required pattern size. For this reason, it is found that even if the lens aberration of the demagnification projection aligner is very small, problems such as the deformation and misalignment of a pattern caused by the lens aberration arise. The deformation, misalignment and the like of a pattern cause variations in characteristics and a reduction in the overlay allowance and the like of a semiconductor integrated circuit device and hence present big problems.

Also, the technology of comparing a pattern actually transferred to a photoresist film with a design pattern and of correcting the pattern of the mask based on the results of the comparison has, for example, the following problems.

First, the above technology present a problem that it takes much time and increases a manufacturing cost to manufacture a photomask. That is, in the above technology, to produce a good photomask, a photomask for inspection needs to be actually manufactured and it takes much time to measure a pattern. In particular, since the lens aberration is different between pattern exposure devices, it is necessary to repeat a series of processes of actually manufacturing, exposing, comparing and correcting the photomask for inspection for each pattern exposure device. This is the same also in the case where one correction process can not completely correct the pattern of the mask. Therefore, the above technology presents a problem that it costs much time, labor, and material to produce one good photomask.

Secondly, the above technology present a problem of a decrease in the accuracy of correction. That is, in the above technology, the pattern actually transferred to the photoresist is compared and observed and the causes of the deformation and misalignment of the transferred pattern include disturbances other than the lens aberration such as the performance and the measuring method of the photoresist film, the completeness of the mask or the like. In the above technology, a defective pattern caused by such disturbances is corrected regarding the defective pattern as being caused by the lens aberration, which results in decreasing the accuracy of correction.

SUMMARY OF THE INVENTION

It is an object of the present invention to provide a technology capable of inhibiting or preventing a pattern abnormality such as the deformation or misalignment of the pattern of a semiconductor integrated circuit device.

It is another object of the present invention to provide a technology capable of shortening a time necessary for manufacturing a semiconductor integrated circuit device.

It is still another object of the present invention to provide a technology capable of reducing a labor necessary for manufacturing a semiconductor integrated circuit device.

It is still another object of the present invention to provide a technology capable of reducing the manufacturing cost of a semiconductor integrated circuit device.

The above and other objects and new features will become apparent from the description of the present specification and the accompanying drawings.

The outline of typical inventions of the inventions disclosed in the present application will be briefly described in the following.

That is, the present invention automatically corrects the pattern data of a mask based on the wavefront aberration data of the lens of a pattern exposure device or an aberration data equivalent to the same and then transfers a predetermined pattern by using a mask made based on the pattern data of the mask after the correction by means of the above pattern exposure device.

Further, the present invention makes the correction to each plane position in an exposed region.

Still further, the present invention makes the different correction according to the plane position in an exposed region.

Still further, the present invention divides an exposed region into predetermined blocks and makes the correction of a pattern data to each block according to the lens aberration corresponding to each block.

BRIEF DESCRIPTION OF THE DRAWINGS

Preferred embodiments in accordance with the present invention will be described in detail based on the following figures, in which:

FIG. 14 is an illustration of the number of terms of a Zernike polynomial;

DETAILED DESCRIPTION OF THE INVENTION

Figure 1:
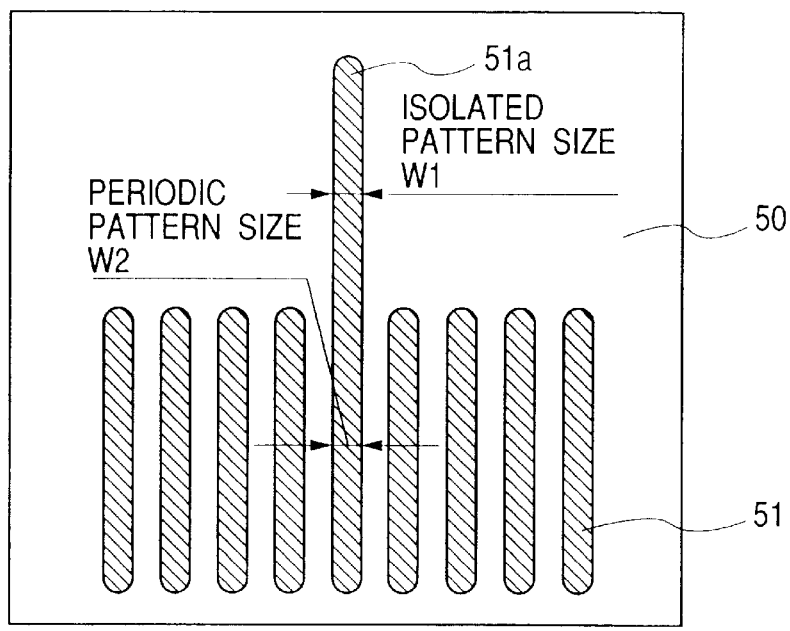
FIG. 1 is a partial plan view showing a part of a line pattern arranged periodically and an isolated line pattern.

Before the present invention will be described in detail, the meaning of technical terms used in the present specification will be described in the following.

1. A semiconductor wafer (semiconductor substrate) means an insulating, anti-insulating or semiconductor substrate such as a silicon single crystal substrate (in general, shaped like a nearly circular plane), a sapphire substrate, a glass substrate, or the like, and a compound substrate thereof.

2. Terms of "light-shielding region", "light-shielding film", and "light-shielding pattern" mean that the region and the like have optical characteristics of transmitting exposure light of less than 40% of exposure light applied to the region and the like. In general, a light-shielding film having a transmissivity of from several percent to less than 30% is used. On the other hand, the terms of "transparent" and "transparent film" mean that a film has optical characteristics of transmitting the exposure light of not less than 60% of the exposure light applied to the film. In general, a transparent film having a transmissivity of 90% or more is used.

3. A term of "photoresist pattern" means a film pattern produced by patterning a photosensitive organic film by a photolithography method. In this connection, this pattern includes merely a resist film having no aperture in the portion concerned.

4. Ultraviolet rays are classified into the following groups in the field of a semiconductor: ultraviolet rays whose wavelengths range from less than about 400 nm to more than about 50 nm; near-ultraviolet rays whose wavelengths are not less than 300 nm; far-ultraviolet rays whose wavelengths range from less than 300 nm to 200 nm or the more; and vacuum ultraviolet rays whose wavelengths are less than 200 nm. In this connection, while the vacuum ultraviolet rays whose wavelengths are less than 200 nm will be mainly described in the main preferred embodiments in accordance with the present invention, it is needless to say that if a modification described in the following preferred embodiment is performed, the present invention can be applied to the region of the far-ultraviolet rays produced by a KrF excimer laser whose wavelengths range from less than 250 nm to 200 nm or the more. Also, the principle of the present invention can be applied to the short wavelength region of ultraviolet rays whose wavelengths range from less than 100 nm to 50 nm or the more.

5. When a mask light-shielding material is referred to as a "metal", it means chromium, chromium oxide and a similar compound of the other metal and widely includes a substance having a light-shielding action such as a single substance including a metal element, a compound, or a composite material.

6. A photomask or a mask is a mask constituting member made of a mask substrate on which a pattern image is formed. On the photomask is formed a pattern one to ten times as large as an actual pattern size. The photomask includes a "reticle" used in a projection alignment using a stepper, a scanner, or a photo repeater, and a phase shift mask.

7. A phase shift mask (or a phase shift reticle) means a photomask (or a reticle) for improving a contrast when a pattern is transferred by selectively shifting the phase of light by means of a phase shifter on a substrate on which a pattern is formed. The types of the phase shift mask includes a Rebenson type, a halftone type and an edge enhancement type.

8. A phase shifter means a substance or a unit of generating a phase shift by modulating the wavelength of light. Also, the phase shift means a difference in a phase generated by a difference in a light speed when light passes through two substances which are different in a refractive index from each other. In the case of the phase shift mask, the phase shift φ between the phase shift mask and air is expressed by an equation of $\phi=2\pi(n-1)d/\lambda$, wherein λ is the wavelength of light, n is the refractive index of a phase shifter, and d is a film thickness.

9. "A halftone-type phase shift mask" is a kind of phase shift mask and has a halftone shifter whose halftone film functions as a phase shifter and a light-shielding film and has a transmissivity ranging from not less than 1% to less than 40% and has an amount of phase shift reversing the phase of light when compared with a portion without this film.

10. "A Rebenson-type phase shift mask" is a kind of phase shift mask of reversing the phases of lights passing through neighboring apertures separated by light-shielding regions each other to produce a clear image by the interference of the lights.

11. A conventional illumination means a non-modified illumination whose light intensity distribution is comparatively uniform.

12. A modified illumination means an illumination whose illuminance is lowered at the center and includes an oblique illumination, a zonal illumination, a multipolar illumination such as quadripolar illumination, a pentapolar illumination or an ultra-high resolution technology using a pupil filter equivalent to those.

13. A pattern abnormality means a state of pattern different from a design pattern such as the deformation, the distortion of the plan shape of a pattern or the misalignment of patterns.

14. A lens aberration means the wavefront aberration of a lens of a pattern exposure device and is obtained, for example, by breaking down into Zernike coefficients derived from the wavefront aberration.

15. In the present specification, "automatically" means that, for example, in the case where an original mask pattern data is processed by using a workstation, a predetermined calculation is performed for the original mask pattern data on a perfectly autonomous basis with the above workstation based on the perfect aberration data of Zernike classification of the pattern exposure optical system of a specific pattern exposure device, or a main wavefront aberration data extracted from the perfect aberration data, or a distortion data equivalent to the perfect aberration data and, in addition, for a specific condition, includes a semi-autonomous computer processing aided by a human judgment: that is, the case in which most of or main portion of a data processing is a computation processing performed by a computer when a comparison is made by converting a manually performed processing into a previously programmed computer processing.

In the following preferred embodiments, when necessary for convenience, the present invention will be described by dividing a plurality of sections or preferred embodiments and, unless explicitly described otherwise, they are not irrelevant to each other but one section or one preferred embodiment relates to the modified example, the detail, or the complementary description of a part or the entire part of the other section or the other preferred embodiment.

Also, when the following preferred embodiments refer to the number of elements (including the number of pieces, a numerical value, an amount, a range, etc.), unless explicitly specified otherwise or clearly limited to a specific number in principle, it is not intended to limit the number to a specific number and may be larger than or smaller than a specific number.

Further, in the following preferred embodiments, it is needless to say that their constituent elements (including element steps, etc.) are not necessarily essential except for the case where they are explicitly specified otherwise or the case where they are thought to be essential in principle.

Similarly, when the following preferred embodiments refer to the shapes of the constituent elements or the position relationship between them, they include ones substantially approximate to or similar to those shapes or the like except for the case where they are explicitly specified otherwise or the case where they are not thought to be those shapes or the like in principle. This is the same for the above numerical value and ranges.

Also, when the following preferred embodiments refer to a semiconductor integrated circuit device, unless explicitly specified otherwise in particular, it includes not only an integrated circuit device formed on a semiconductor or insulating substrate such as a silicon wafer, a sapphire substrate or the like, but also an integrated circuit device formed on the other insulating substrate like a glass substrate, such as a thin film transistor (referred to as TFT) and a super-twisted-nematic (STN) liquid crystal.

The preferred embodiments in accordance with the present invention will be described in detail based on the accompanying drawings. In this connection, the same reference characters are attached to the parts having the same functions throughout the drawings to describe the preferred embodiments, and the description thereof will be omitted.

Preferred Embodiment 1

First, before the description of the technical philosophy of the present invention, the technical problems studied by the present inventor will be described.

A pattern abnormality is ascribable broadly to two kinds of causes described in the following: the first pattern abnormality is caused by an optical proximity effect generated by the effects of neighboring patterns in the layout of the patterns and the second pattern abnormality is caused by the lens aberration of a projection aligner.

The magnitude of the optical proximity effect depends on the conditions of an illumination or a mask when the pattern is formed, and increases, for example, when a phase shift mask is used or when an ultra-high resolution technology such as a modified illumination or the like is used. For example, FIG. 1 shows a plurality of line patterns 51 and an isolated line pattern 51a which are arranged in a period of 1:1 on a semiconductor substrate 50. The plan shape of the pattern produced when a conventional illumination is used as an exposure light source is different from the plan shape of the pattern produced when a zonal illumination, one of the ultra-high resolution technology, is used as an exposure light source. When the zonal illumination is used, it can improve various kinds of margins such as the depth of focus or the like in the plurality of line patterns 51 because of the effect of the zonal illumination as compared with the case where the conventional illumination is used. However, in the isolated line pattern portion 51a formed at the same time, a size W1 is smaller than the size W2 of the line pattern 51, which reduces a transfer margin as compared with the case where the conventional illumination is used.

Figure 2:
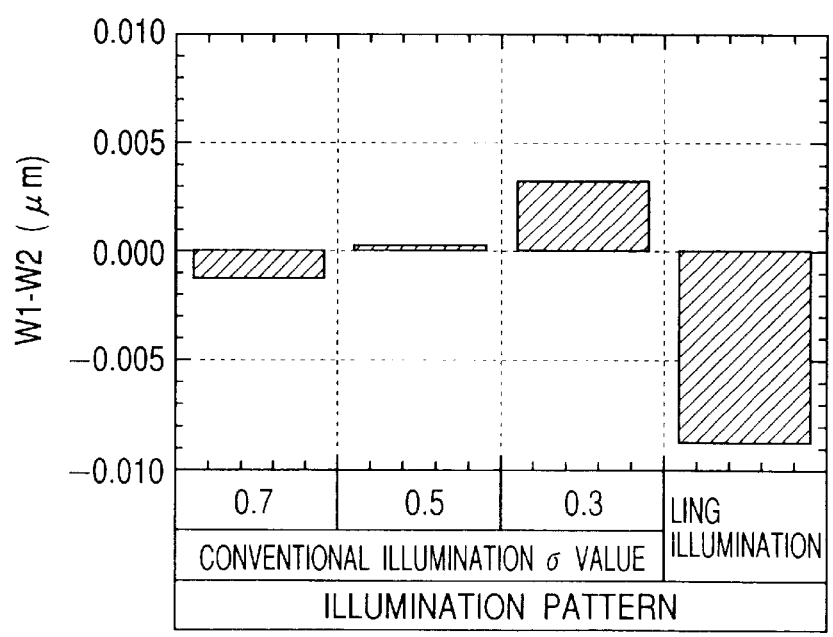
FIG. 2 is an illustration showing the size of an isolated line pattern portion obtained when the size of a line pattern is formed in 0.20 μm in the case where a conventional illumination is used and in the case the case wherein a modified illumination is used.

FIG. 2 shows a difference between the size W2 of the line pattern 51 and the size W1 of the isolated line pattern portion 51a obtained when the size W2 is formed in 0.20 μm in the case where the conventional illumination is used and in the case where the zonal illumination, one of the modified illumination, is used. Here, an exposure processing is performed under the following conditions: for example, a KrF excimer laser having a wavelength λ of 0.248 μm is used as exposure light; the numerical aperture NA of a lens of a pattern exposure device is 0.60. Also, for example, even in the conventional illumination, if an α-value is reduced to 0.3 from 0.7, the size of the isolated line pattern portion 51a increases. Also, an application of the zonal illumination presents a problem that the size W2 of the line pattern 51 is reduced to 0.19 μm, which is about 0.01 μm smaller than a target size of 0.20 μm. As for the above-mentioned pattern abnormality caused by an optical proximity effect, the same abnormalities are produced in a shot (an exposed region) formed at a time and, therefore, an optical proximity correction (hereinafter referred to as OPC) is usually applied. In the above case, the OPC is performed by arranging a dummy pattern, which is not basically necessary at a predetermined position, for the isolated line pattern portion 51a or by increasing the line width of the isolated line pattern portion 51a. This can produce a good pattern and hence is usually used at the present time.

On the other hand, aside from the pattern abnormality caused by the optical proximity effect, a pattern abnormality is caused by the aberration of a lens used in a projection aligner used for forming the pattern, that is, a stepper or a scanner. The pattern abnormality caused by the aberration of the lens is characterized in that the pattern abnormality is different at positions in one shot. This is caused by that the aberration is not uniform in the lens (in the surface). Accordingly, unlike the above-mentioned pattern abnormality caused by the optical proximity effect, if the pattern exposure device or the lens is different, the amount of the pattern abnormality is different. Also, the amount of the pattern abnormality is different even at positions in one shot.

Figure 3A:
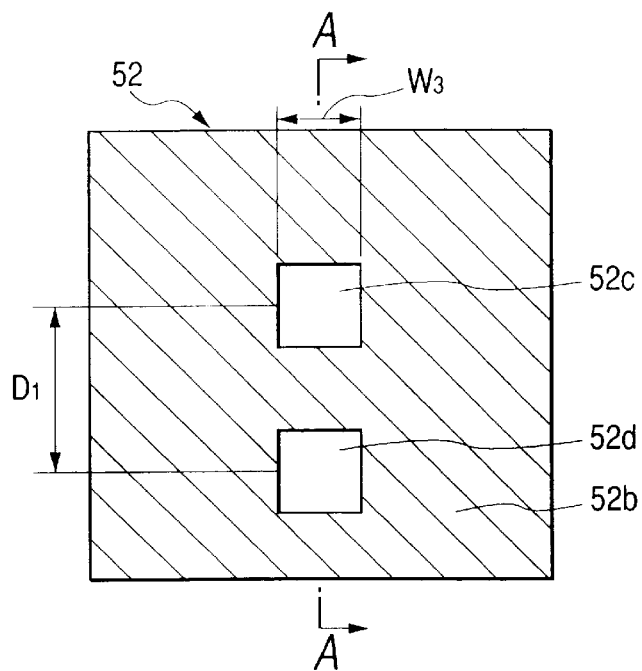
FIG. 3(a) is a plan view of the essential part of an example of a photomask for forming an aperture pattern, and (b) is a cross-sectional view taken on a line A—A in (a), and (c) is an illustration showing the amplitude distribution of transmitted light in the case where a photomask in (a) is used, and (d) is an illustration showing the light intensity distribution of a projected image in the case where a photomask in (a) is used.
Figure 3B:
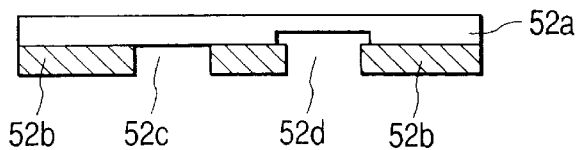

One example of a pattern abnormality caused by the lens aberration of a demagnification projection aligner will be described with reference to FIG. 3 to FIG. 7. FIG. 3(a) is a plan view of an essential portion of one example of a phase shift mask 52 for forming a hole pattern such as a contact hole or a through hole and FIG. 3(b) is a cross-sectional view taken on a line A—A in FIG. 3(a). A reference character 52a designates a mask substrate and a reference character 52b designates a light-shielding film and reference characters 52c, 52d designate patterns. Also, a reference character W3 designates the design size of one side of the patterns 52c, 52d and a reference character D1 designates a distance between the center of the pattern 52c and that of the pattern 52d.

The mask substrate 52a is made of, for example, a transparent synthetic quartz glass substrate. The light-shielding film 52b is acceptable if it can almost shield exposure light, and is made of, for example, a chromium (Cr) film. Also, the patterns 52c, 52d are, for example, holes formed like a square in a plan shape in the part of the light-shielding film 52b and form a light transmitting region (transparent region). At the pattern 52d is arranged a phase shifter to generate a phase shift of about 180 degrees between lights passing through the patterns 52c and 52d (to reverse the phase of light, ditto for the following). Here, as the phase shifter is used, for example, a method of scraping the mask substrate 52a exposed from the pattern 52d to the extent of producing an objective phase shift. However, any phase shifter is acceptable if it has a structure capable of producing a phase shift of about 180 degrees between the lights passing through the objective patterns 52c and 52d, and it is not intended to limit the phase shifter to this type of phase shifter but various modified phase shifters can be used, for example, a glass (SOG: Spin On Glass) film can be also used.

Figure 3C:
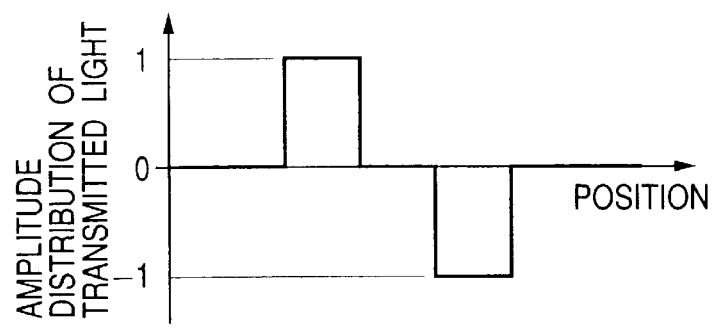
Figure 3D:
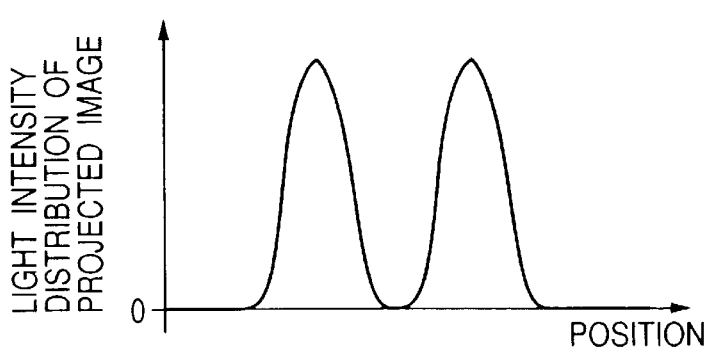

The amplitude distribution of light passing through the phase shift mask 52 will be shown in FIG. 3(c), in which light passing through the pattern 52c of the light transmitting region has a positive sign, whereas the phase of light passing through the pattern 52d where the phase shifter is disposed is reversed to have a negative sign. If this light is projected on a semiconductor wafer through the lens of the demagnification projection aligner, as shown in FIG. 3(d), the intensity of the light becomes almost zero at a portion directly under the boundary between the pattern 52c and the pattern 52d because the phase is reversed at the boundary. This can prevent the intensity of the light from expanding and hence can form a high-contrast fine pattern.

Figure 4A:
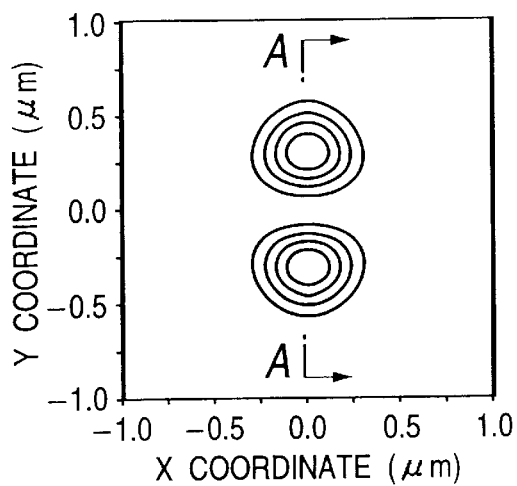
FIG. 4(a) is an illustration showing a plane light intensity distribution in the case where a projecting lens does not have an aberration, and (b) is an illustration showing a plane light intensity distribution in the case where a projecting lens has an aberration, and (c) is an illustration showing the cross-sectional light intensity distribution taken on a line A—A in (a) and (b)
Figure 4B:
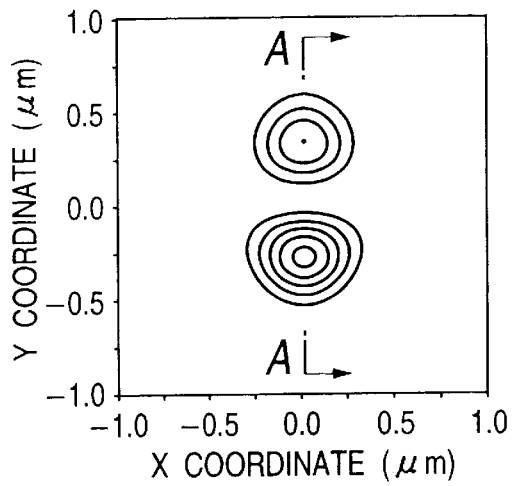
Figure 4C:
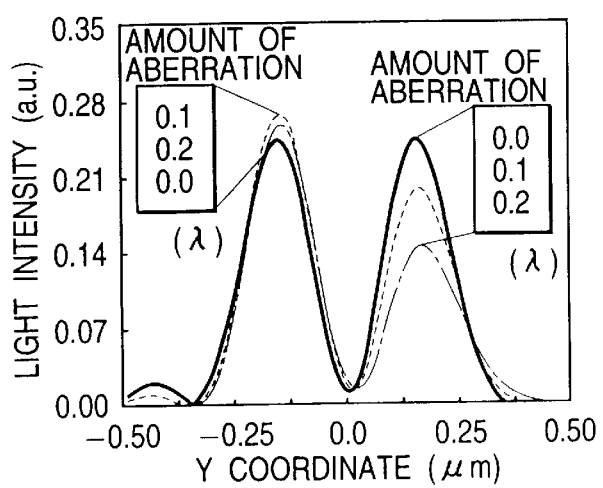

A plane light intensity distribution obtained by using the phase shift mask 52 shown in FIG. 3 is shown in FIG. 4. FIG. 4(a) shows the plane light intensity distribution in the case where a projection lens has no aberration and FIG. 4(b) shows the plane light intensity distribution in the case where the projection lens has an aberration. Further, FIG. 4(c) shows cross-sectional light intensity distributions taken on a line A—A in FIG. 4(a) and FIG. 4(b). In this connection, in FIG. 4(c), a solid line shows a cross-sectional light intensity distribution in the case where a projection lens has no aberration, and a broken line and a single dot and dash line show cross-sectional light intensity distributions in the cases where the projection lens has an aberration.

In the case where the projection lens has no aberration, light intensity distributions of the transferred patterns of the patterns 52c, 52d of the phase shift mask 52 are identical to each other in the plan shape, the pattern size, and the state of distribution (level of peak, etc.), as shown by solid lines in FIG. 4(a) and FIG. 4(c). In contrast to this, in the case where the projection lens has an aberration, it is apparent from FIG. 4(b) that the transferred patterns of the patterns 52c, 52d of the phase shift mask 52 are different from each other in the pattern size. Also, it is apparent from FIG. 4(c) that the light intensity distributions of the transferred patterns of the patterns 52c, 52d are different from each other in the level of peak and that the patterns are shifted in position. The difference in the light intensity and the shift in position of the pattern vary according to the magnitude of the lens aberration.

Figure 5:
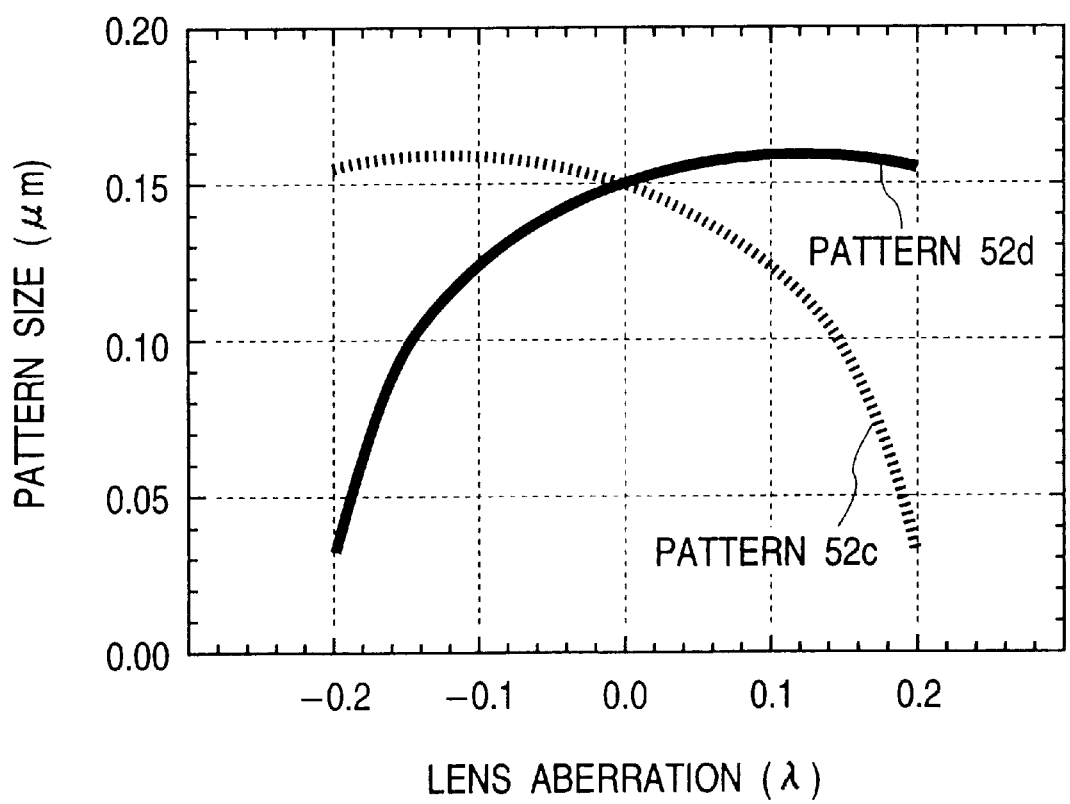
FIG. 5 is an illustration showing a change in a pattern size obtained in the direction of a line A—A in FIG. 3(a) by a lens aberration in the case where an exposure processing is performed by using a photomask shown in FIG. 3(a)
Figure 6A:
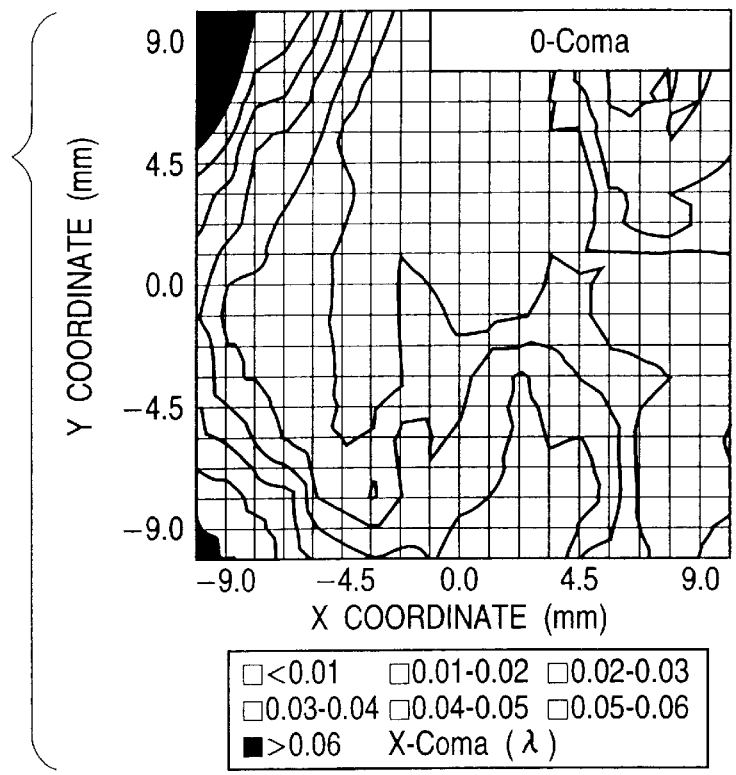
FIGS. 6(a), (b) are illustrations showing the results of measurement of a coma aberration.
Figure 6B:
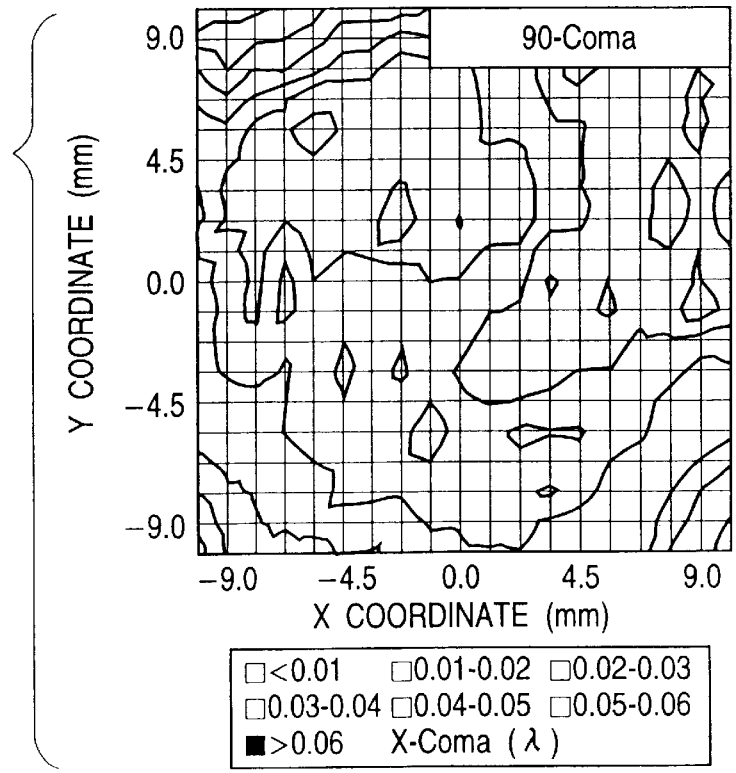
Figure 7A:
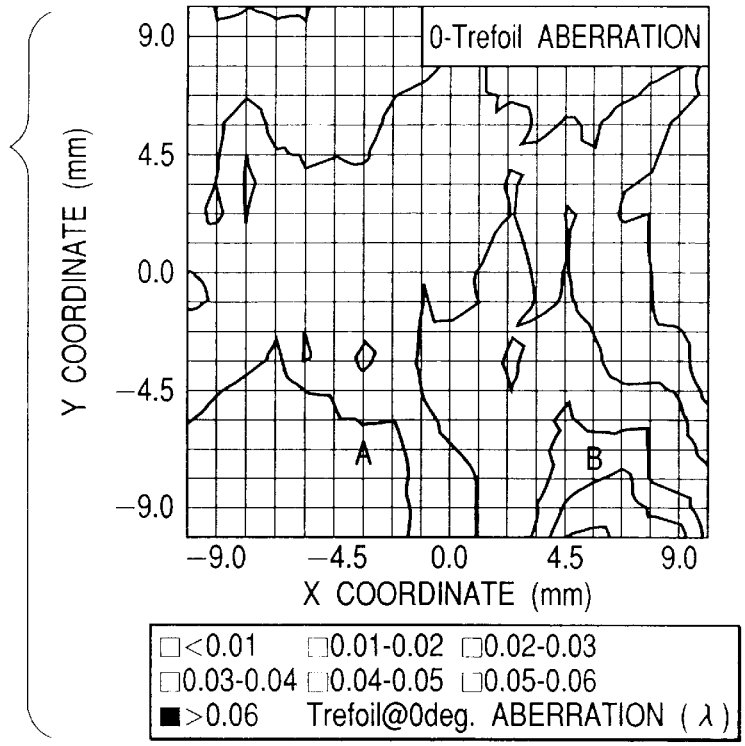
FIGS. 7(a), (b) are illustrations showing the results of measurement of a Trefoil aberration.
Figure 7B:
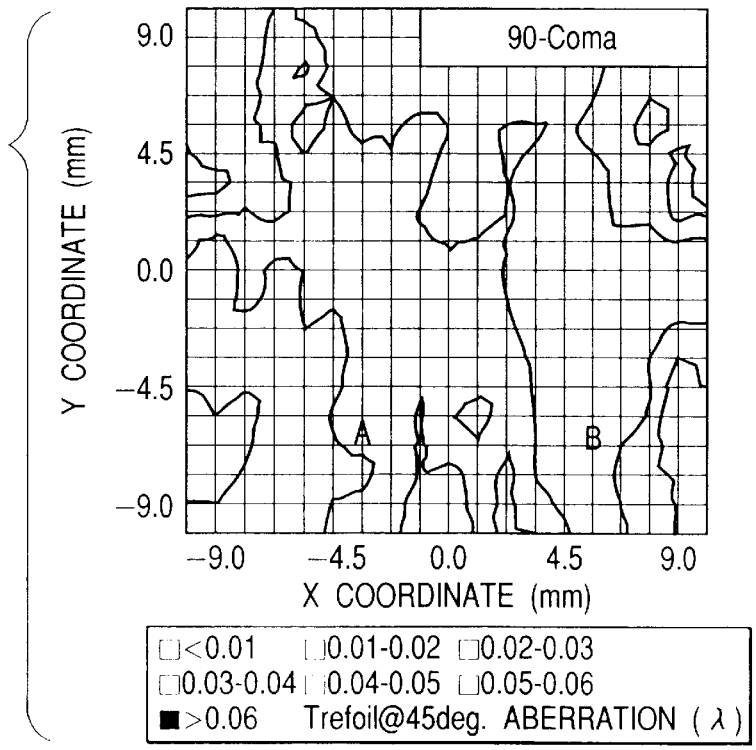

FIG. 5 shows a change in the pattern size produced in the direction of a line A—A in FIG. 3(a) by the lens aberration in the case where an exposure processing is performed by using the phase shift mask 52 shown in FIG. 3(a). In this connection, in this exposure processing, for example, a KrF excimer laser having an exposure light wavelength λ of 0.248 μm and a scanner having a numerical aperture NA of 0.68 were used. The phase shift between the lights passing through the patterns 52c and 52d is, for example, 180 degrees and the design size W3 of one side of each of the patterns 52c and 52d was, for example, about 0.15μm (0.60 μm on the mask, when the magnification of the projection aligner optical system is ¼). Also, the distance D1 between the center of the pattern 52c and that of the pattern 52d was about 0.30 μm (about 1.20 μm on the mask, when the magnification of the projection exposure optical system is ¼).

In FIG. 5, a vertical axis designates a pattern size and a lateral axis designates the amount of a lens aberration. Also, a solid line shows the transferred pattern size of the pattern 52d shown in FIG. 3(a) and a broken line shows the transferred pattern size of the pattern 52c shown in FIG. 3(a). As shown in FIG. 5, a difference in the pattern size increases as the aberration of the lens increases. The scanner used in the present preferred embodiment had a coma aberration, one of lens aberration, of 0.10λ. In this case, the transferred pattern size of the pattern 52d was, for example, 0.159 μm and the transferred pattern size of the other pattern 52c was, for example, 0.1233 μm. Accordingly, the difference between the two patterns 52c and 52d was 35.7 nm. In this connection, the results of measurement of the coma and Trefoil aberrations of the predetermined demagnification projection aligner which the present inventor obtained by experiment will be graphically shown in FIGS. 6(a), (b) and FIGS. 7(a), (b).

In this connection, since it is difficult for a so-called device maker forming a pattern by means of a pattern exposure device to obtain a detailed quantitative wavefront aberration, for example, as disclosed in Japanese Paten Laid-Open No. 3-215861, the maker has taken the following steps to avoid a pattern abnormality caused by the lens aberration: manufacturing a photomask; performing an exposure processing by using the photomask to actually transfer the pattern; measuring the transferred pattern with a SEM or the like; and if an unallowable deformation of the pattern is produced, feeding back a correction for the unallowable deformation of the pattern to a design data to correct the pattern abnormality caused by the lens aberration. However, in this case, as described above, there remain various problems to be solved: that is, much time and labor are necessary for manufacturing a semiconductor integrated circuit device; manufacturing costs increase; and correction accuracy decreases.

For this reason, according to the technical philosophy of the present invention, a suitable pattern correction corresponding to a pattern abnormality caused by the lens aberration of a projection aligner is automatically performed by a computer.

Figure 8:
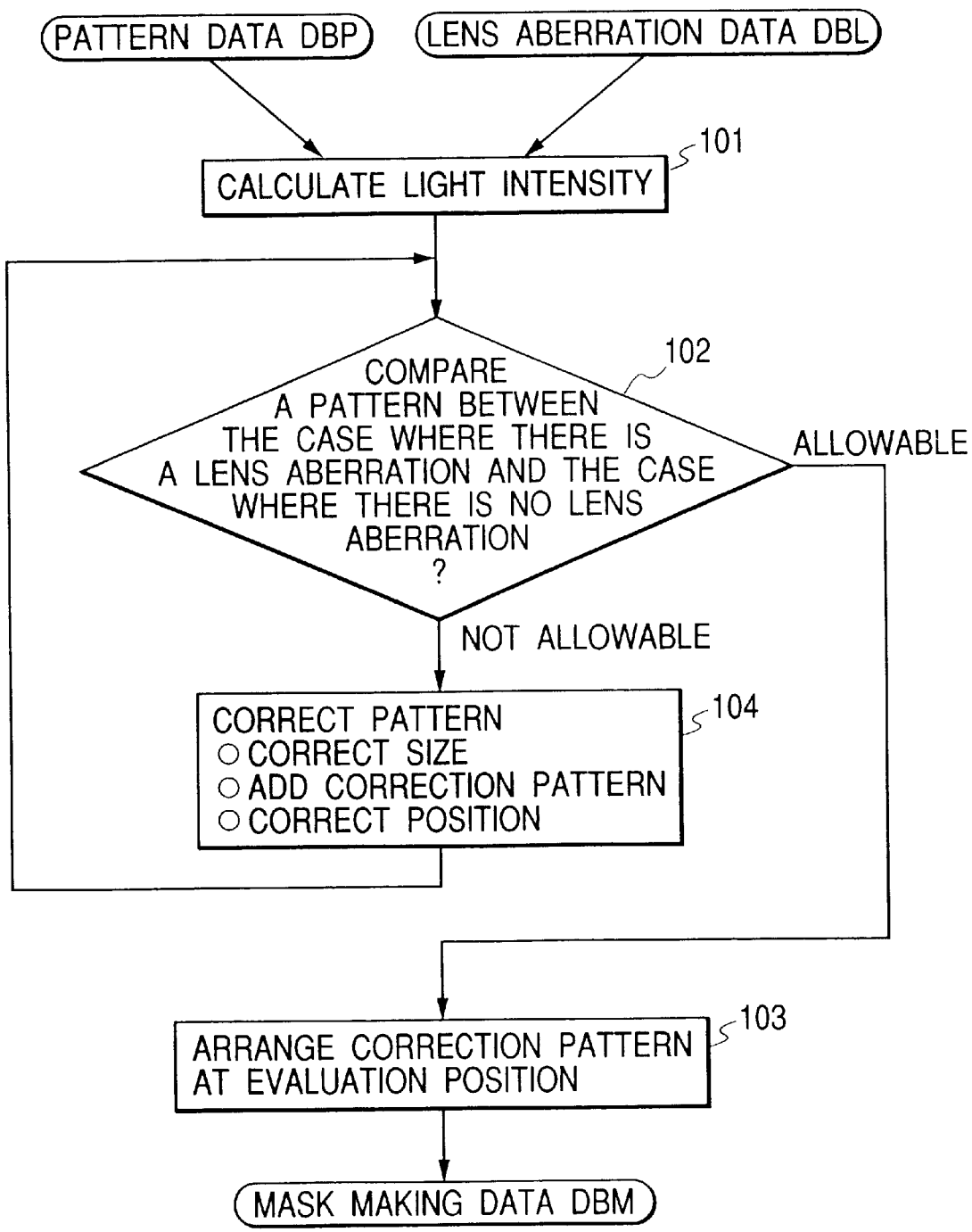
FIG. 8 is a flow chart of a method of forming a pattern of one preferred embodiment in accordance with the present invention.

FIG. 8 shows the basic flow of the preferred embodiment 1 in accordance with the present invention. Usually, a pattern data made from a circuit data to be made is a mask making data and a mask is made by using the mask making data. Also, in the case where the above-mentioned optical proximity correction (OPC) is used, a section of judging if the OPC processing is required or not, a section of processing a pattern OPC, and a section of verifying the pattern OPC are inserted between a section of making a pattern data and a section of making a mask making data.

In the present preferred embodiment 1, the wavefront aberration of the lens of the demagnification projection aligner is used as a data base (lens aberration data DBL). First, since the wavefront aberration of the lens is different at positions in one shot (exposed region) of the projection aligner, in the present preferred embodiment 1, the light intensity of the pattern is calculated by using the wavefront aberration data of the lens at positions in one shot (exposed region) of the pattern data DBP of the mask (step 101). Next, the results of calculation in the case where the lens aberration is considered are compared with the results of calculation in the case where there is no lens aberration (ideal value). In this case, it is, for example, a shift in the position of the side of the obtained pattern and the like that are to be compared. Information of the misalignment of the pattern is also obtained by comparing the shift in the position of the side of the obtained pattern and, therefore, it is possible to correct the position (step 102). In this manner, when a comparison of the pattern is made between the case where there is the lens aberration and the case where there is no lens aberration, if a change in size caused by the lens aberration is allowable, the processing proceeds to the next step 103. On the other hand, if it is not allowable, the processing proceeds to a step 104 in which a correction is made to the pattern. In this step, for example, a size correction of moving the sides of the pattern, a correction of adding a sub-pattern, or a correction of arrangement is automatically made as the correction of the pattern. The amount of correction is automatically calculated based on the above results of calculation of the light intensity calculation (results of comparison). The light intensity calculation is again performed for the results after making the above correction (step 101). That is, the processing is returned to the step 101. This processing is repeated until the change in size does not exceed an allowable level in the step 102, and when it comes to be within the allowable level, the processing proceeds to a step 103. In the step 103, a correction pattern is arranged at an evaluation position. In this manner, a mask making data DBM is made. Such a correction of the pattern data is made to each specific pattern exposure device. This is because the pattern exposure devices are different from each other in the lens aberration and because it is necessary to make a correction to each pattern exposure device. The use of the technical philosophy of the present invention makes it possible to respond to such a difference in the lens aberration between the pattern exposure devices. In this connection, in the next step, a photomask is manufactured by using the mask making data DBM and then an exposure processing is performed by using the photomask to transfer a predetermined pattern to a photoresist film on a substrate to be processed.

In this manner, a comparison of the results of calculation in the case where the lens aberration is considered and the results of calculation in the ideal case where there is no lens aberration and a correction based on the comparison are repeatedly made until the pattern abnormality falls within the allowable range, that is, the deformation and a difference in size of the pattern fall within the allowable levels, whereby a good pattern can be finally formed. Accordingly, a pattern almost identical to a pattern obtained in the case where there is no lens aberration, that is, a pattern close to an ideal pattern can be obtained. That is, irrespective of the magnitude of the lens aberration, an ideal transferred pattern close to the state of no aberration can be obtained. In particular, a more ideal pattern can be formed in the whole shot area by correcting the pattern in accordance with the distribution of the aberration in the shot area. Also, it is possible to automatically correct the pattern abnormality caused by the lens aberration with the most suitable values depending on the positions for the whole shot area by providing information such as the distribution, the magnitude and the direction of the lens aberration of various projection aligners as a data table on a layout editor.

Also, since the correction is made on a computer, it is possible to reduce processes of actually manufacturing a photomask for inspection and measuring the photomask in actuality, and the like. For this reason, the manufacturing time of the photomask can be substantially reduced. Also, since the manufacturing process of the photomask for inspection can be reduced, it is possible to eliminate the waste of material used for the photomask for inspection.

Further, since the light intensity is calculated at the step of correction, elements of the pattern abnormalities caused by disturbances such as the performance of a resist film, a measurement environment, and the effect of the completeness of the mask do not become the elements of the correction and, therefore, the correction of the pattern abnormalities can be more correctly made. Accordingly, the correction accuracy of the pattern can be improved. However, the correction of the pattern in accordance with the aberration is not necessarily made by the pattern. For example, it is also possible to divide one shot area into region blocks in accordance with aberration measurement points and to make the correction to each region block according to the lens aberration corresponding to the region block. Even in this case, the correction can be made with high accuracy.

If this technology of the present invention is applied to the manufacturing process of a semiconductor integrated circuit device, the margin of overlay of the pattern can be reduced and a higher-density pattern arrangement can be realized and the semiconductor integrated circuit device can be manufactured by using an optical lithography. Specifically, the misalignment of the pattern caused by the lens aberration could be reduced to about one half of that caused by the technology studied by the present inventor, whereby a higher-density pattern arrangement could be realized.

Also, since the pattern abnormality can be regulated or prevented, a change in characteristics of the semiconductor integrated circuit device can be inhibited or prevented, whereby the yield and the reliability of the semiconductor integrated circuit device can be improved. Specifically, the rate of defective of the semiconductor integrated circuit device could be reduced to two thirds. Also, the time required for manufacturing the semiconductor integrated circuit device could be substantially reduced and the manufacturing process could be simplified. Further, the manufacturing cost of the semiconductor integrated circuit device could be reduced.

Figure 9A:
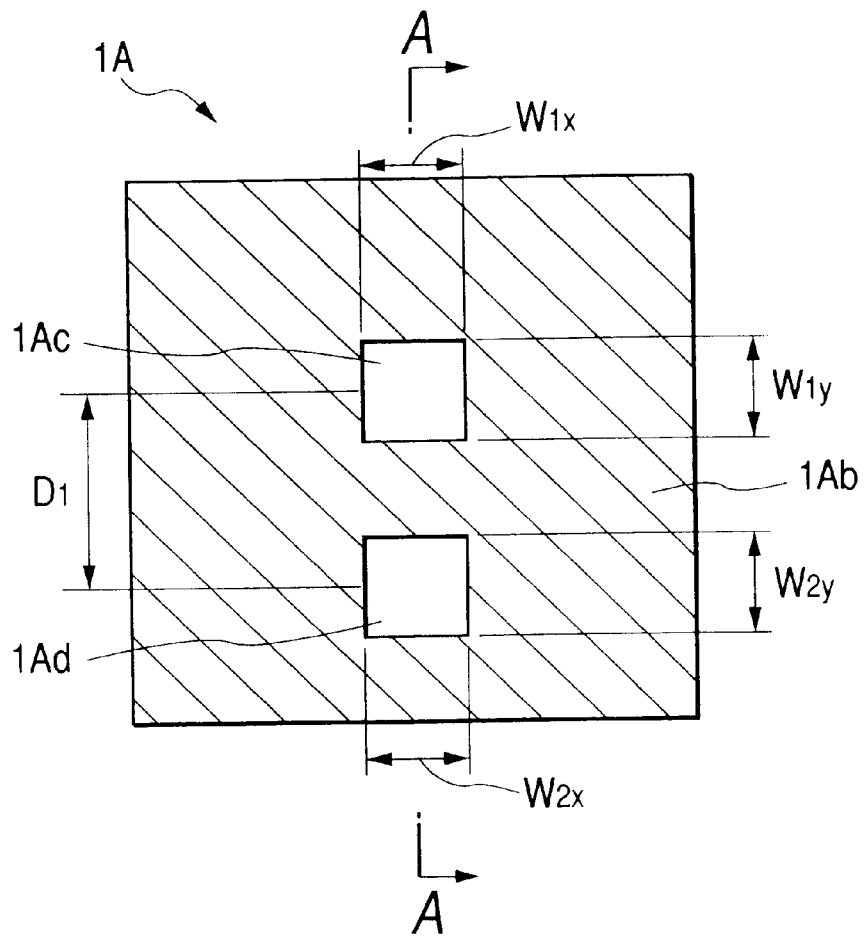
FIG. 9(a) is a plan view of an essential portion of a photomask after a correction according to the technical philosophy of the present invention and (b) is a cross-sectional view taken on a line A—A in (a)
Figure 9B:
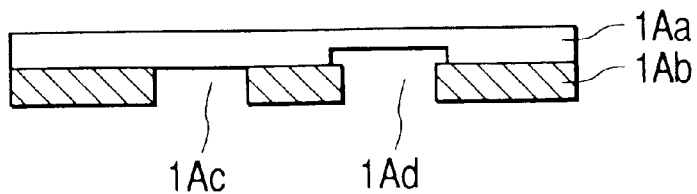

One example obtained by applying the technical philosophy of the present invention described above to a phase shift mask shown in FIG. 3(a) is a phase shift mask 1A shown in FIG. 9. FIG. 9(a) is a plan view of an essential portion of the phase shift mask 1A and FIG. 9(b) is a cross-sectional view taken on a line A—A in FIG. 9(a). A mask substrate 1A$i$ $a$ and a light-shielding film 1A$b$ are identical to the mask substrate 52$a$ and the light-shielding film 52$b$ shown in FIG. 3. Patterns 1A$c$, 1A$d$ are patterns corresponding to the patterns 52$c$, 52$d$ shown in FIG. 3 and, for example, they are formed in a rectangle in a plan and the plan size of the pattern 1A$c$ is made larger than the plan size of the pattern 1A$d$ by the above-mentioned correction. The design sizes W1x, W1y of sides of the pattern 1A$c$ are, for example, 0.17 $\mu$m for W1x, 0.151 $\mu$m for W1y (if the magnification of a projection aligner optical system is ¼, W1x=0.68 $\mu$m and W1y=0.60 $\mu$m on the mask). Also, the design sizes W2x, W2y of sides of the pattern 1A$c$ are, for example, 0.14 $\mu$m for both W2x and W2y (if the magnification of a projection aligner optical system is ¼, W1x=W1y=0.56 $\mu$m on the mask). The above-mentioned phase shifter was arranged at the pattern 1A$d$ such that the phases of lights passing through the patterns 1A$c$, 1A$d$are changed by about 180 degrees.

The manufacturing method of the phase shift mask 1A is as follows. First, metal such as chromium is deposited on the whole main surface of the mask substrate 1A$a$ by a sputtering method or the like and then an electron beam sensing resist film is applied to the metal. Next, a predetermined pattern is transferred to the resist film by using an electron beam lithography system or the like. When this pattern is transferred, the pattern data of the photomask subjected to a correction processing by the above technical philosophy of the present invention is used as an electron beam lithography data. Then, the above metal exposed from the resist pattern transferred to the electron beam sensing resist film is etched away by an etching method by using the resist pattern as an etching mask to thereby form on the metal a plurality of aperture regions (that is, pattern) exposing parts of the mask substrate 1A$a$. Then, a phase shifter is made selectively on the predetermined pattern of the plurality of aperture regions (that is, pattern) formed on the metal. In the present preferred embodiment 1, the phase shifter is a trench which is formed by selectively removing the mask substrate 1A$a$ by a predetermined depth from the predetermined aperture region. In the case where a transparent film is made the phase shifter, it is recommended that a SOG film for forming the phase shifter be applied to the whole main surface of the mask substrate 1A$a$ and be then patterned by a photolithography technology and an etching technology to thereby form the phase shifter made of the SOG film.

Figure 10A:
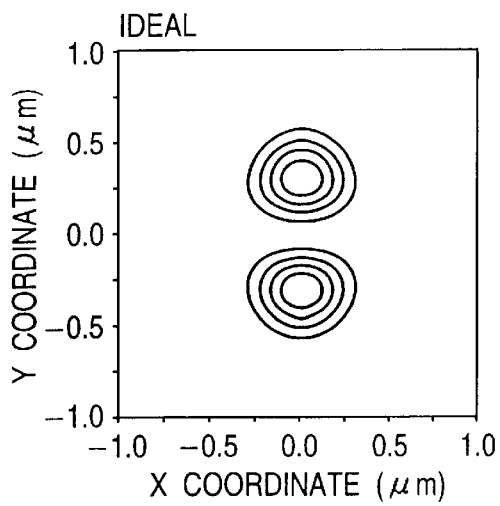
FIG. 10(a) is an illustration showing a plane light intensity distribution in the case where there is no lens aberration (ideal distribution), and (b) is an illustration showing a plane light intensity distribution before a correction in the case where there is a coma aberration, one of the lens aberration, and (c) is an illustration showing a plane light intensity distribution after a correction in the case where there is a coma aberration.
Figure 10B:
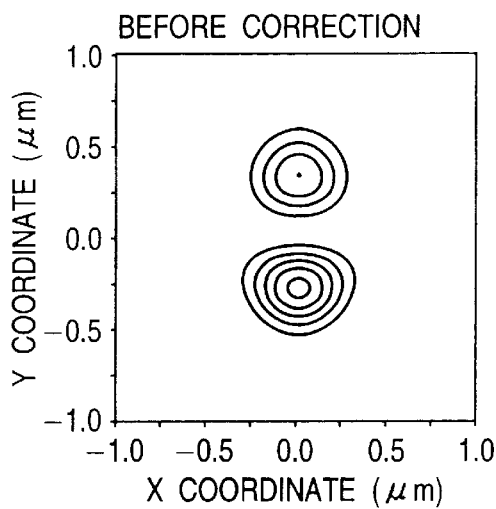
Figure 10C:
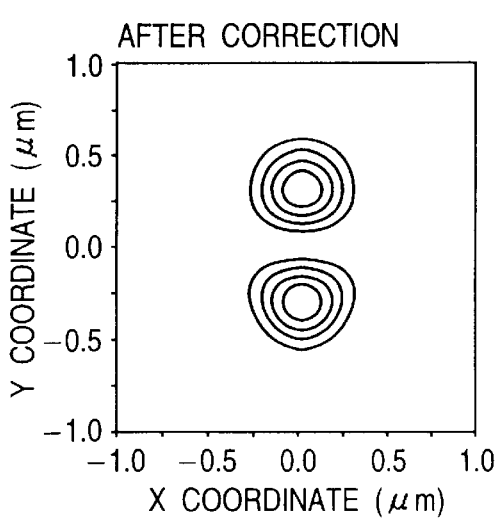

A light intensity distribution obtained in the case where the exposure processing is performed by using such a phase shift mask 1A subjected to the correction will be described with reference to FIG. 10. FIG. 10($a$) shows a plane light intensity distribution in the case where there is no lens aberration (an ideal case) and FIGS. 10($b$), ($c$) show the plan light intensity distributions in the case where a coma aberration, one of the lens aberration, is, for example, about 0.10$\lambda$.. FIG. 10($b$) shows the plan light intensity distribution before the pattern correction and FIG. 10($c$) shows the plan light intensity distribution after the pattern correction shown in FIG. 9. There is a big difference in the plane light intensity distribution between FIGS. 10($a$) and ($b$), but in FIGS. 10($a$) and ($c$), the plane light intensity distributions are made almost identical to each other by the effect of the pattern correction. In this connection, a scanner having an exposure wavelength $\lambda$ of 0.248 $\mu$m and a numerical aperture NA of 0.68 was used as an pattern exposure device.

This phase shift mask 1A is, for example, a mask for forming the above aperture pattern. Accordingly, in the case where the exposure processing using this phase shift mask 1A is used, a photoresist pattern is formed in which aperture forming regions are exposed and the portion other than the aperture regions is covered. Each of the aperture forming regions corresponds to each of the patterns 1A*c*, 1A*d* and the plan shape of the aperture forming region generally has round corners and is formed in a circle. In the manufacturing process of the semiconductor integrated circuit device, a semiconductor wafer is subjected to an etching processing by using the photoresist pattern as an etching mask to thereby make apertures in parts of an interlayer insulating film or the like of an underlying layer exposed from the photoresist pattern.

Figure 11:
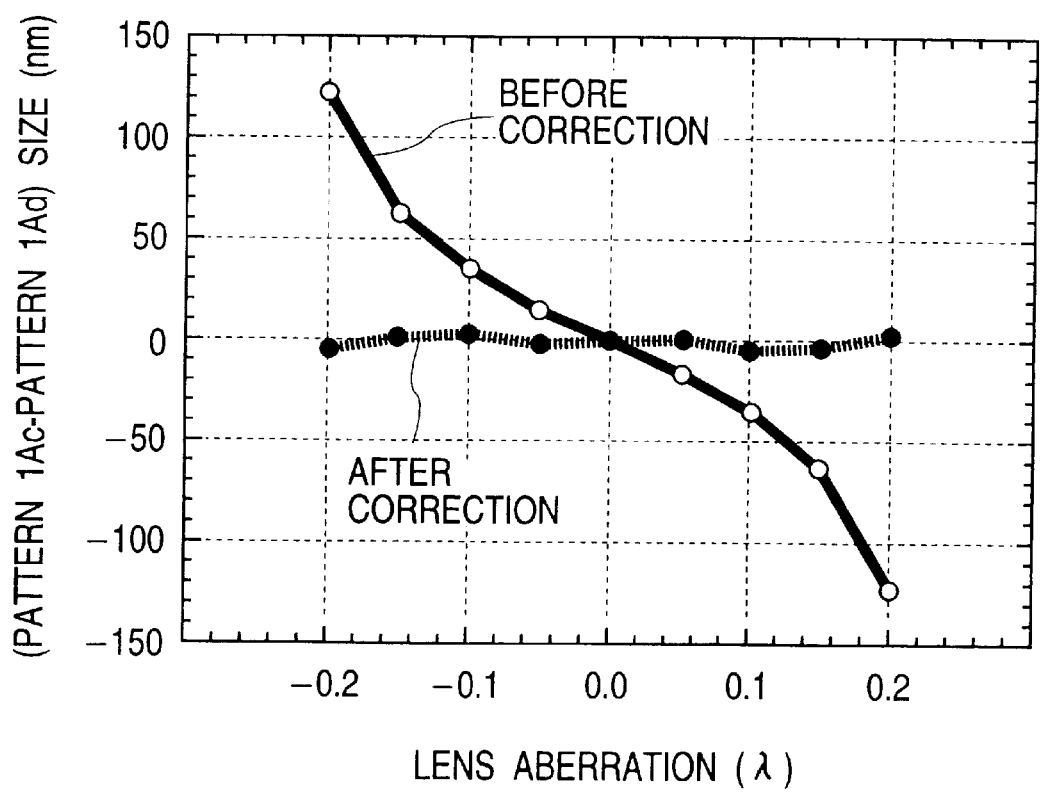
FIG. 11 is an illustration showing a relationship between the lens aberration and a difference between the pattern sizes before and after a correction, one of the lens aberration.

Next, a relationship between a lens aberration and a difference in size will be shown in FIG. 11 for before and after the pattern correction. Although the difference in size was not zero because of the layout and the minimum grid when the mask is formed, according to the present preferred embodiment 1, the difference in size with respect to a target which was about 35.7 nm at the maximum before the pattern correction could be reduced to about 3.0 nm after the pattern correction. However, while the coma aberration has been described here, the kind of aberration to be corrected is not limited only to the coma aberration. There are many kinds of aberrations having an effect on the deformation, the misalignment and the like of the pattern and, for example, Trefoil aberration expressed by an equation of $(\beta^3 \times \cos 3\theta)$ or an equation of $(\beta^3 \times \sin 3\theta)$ of the Zernike coefficient usually used as a coefficient expressing the lens aberration also deforms the pattern substantially, which can be solved by using the technical philosophy of the present invention. Also, there are many kinds of lens aberrations but it is not necessary to solve all the aberrations. Even the correction of the effect of only a desired lens aberration can produce a sufficient effect.

Figure 12:
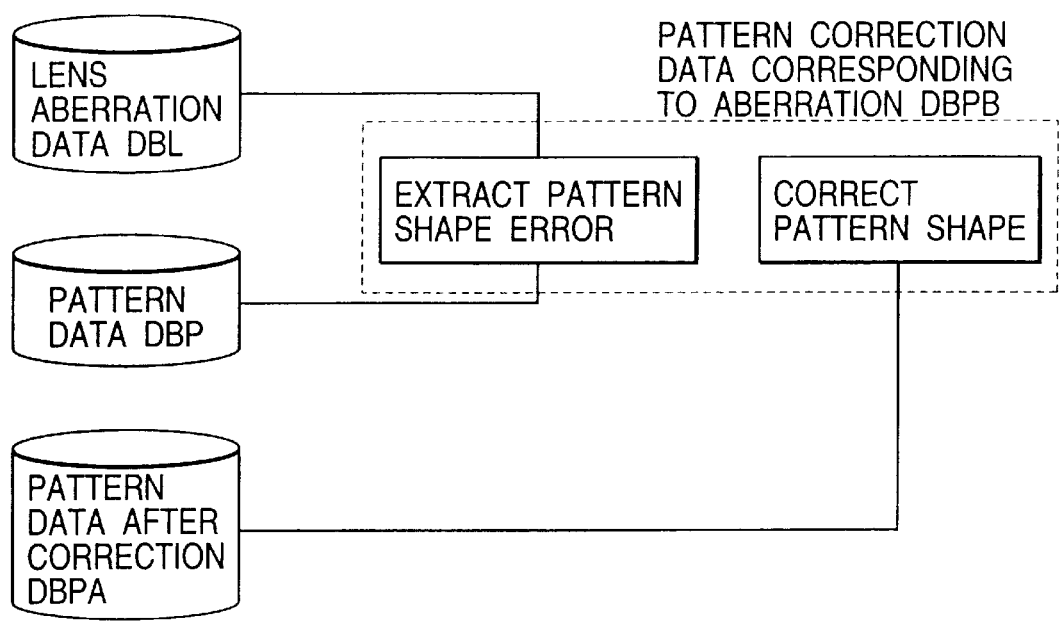
FIG. 12 is an illustration showing a modified process flow for forming a pattern which is one preferred embodiment in accordance with the present invention.

Also, the technical philosophy of the present invention can be applied to produce an effect if the following flow is satisfied at the minimum: that is, first, finding a lens aberration to be corrected of a projection aligner for transferring a pattern; secondly, evaluating the effect which the lens aberration to be corrected has on a pattern by using a light intensity calculation; and thirdly, changing a layout in accordance with the lens aberration such that an almost ideal pattern can be mathematically produced. However, further, it is desirable that a flow shown in FIG. 12 is adopted. That is, a pattern data after the pattern correction DBPA is stored and is used for the following process of manufacturing a photomask. For example, the pattern data after the pattern correction DBPA is used as a pattern correction data corresponding to aberration DBPB and a data for correcting a pattern shape.

Next, one example of a wavefront aberration measurement used for correcting a pattern in accordance with the present invention will be described.

Figure 13:
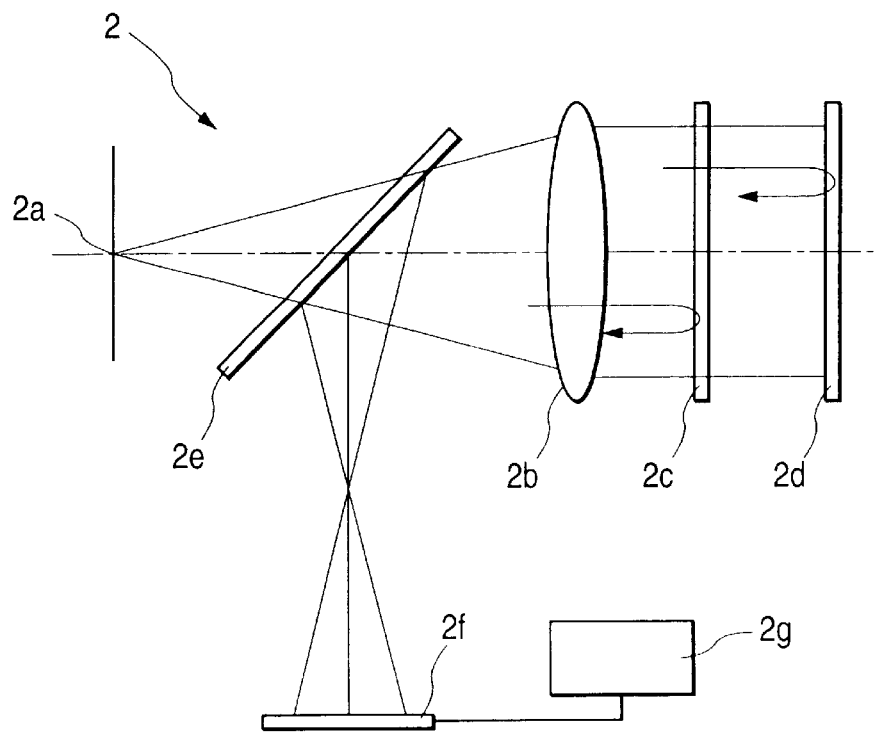
FIG. 13 is an illustration of the mechanism of a Fizeau interferometer.

A wavefront aberration used in the present invention is obtained by the inspection of a projection lens and usually measured with an interferometer. The mechanism of a simple Fizeau interferometer 2 will be shown as an example in FIG. 13. Coherent light of single wavelength or laser light is entered through a slit 2*a*. Here, for example, KrF excimer laser light having the a wavelength of 248 nm identical to an exposure light wavelength in the case of using a lens was used. A reference character 2*b* designates a collimetor lens which makes incident light parallel light. A reference character 2*c* designates a semi-transparent base plate and a reference character 2*d* designates a matter to be checked. Here, the matter to be checked 2*d* is a projection lens for measuring a wavelength aberration. Light reflected by the semi-transparent base plate 2*c* is made to interfere with light reflected by the matter to be tested 2*d* and is reflected by a semi-transparent plate 2*e* to make interference fringes on an observation surface 2*f*. The interference fringes is measured with an imaging device such as a TV camera or the like. The information of the interference fringes obtained by the imaging device is analyzed by using a computer 2*g* to calculate the data of the objective wavefront aberration. In general, a plurality of points in one shot is measured by using this device. In the present preferred embodiment, the data which is obtained by breaking down the data of the wavefront aberration into a Zernike polynomial is used. The terms of the Zernike polynomial will be shown in FIG. 14. A lens aberration is determined for each term. For example, designates a shift in focus, Z4 designates a spherical aberration, and Z7 designates a coma aberration.

Also, the above-mentioned method needs a specifically designed measuring device and because it is very difficult to measure the wavefront aberration after the projection aligner is installed in a plant or the like, methods of measuring a part of the lens aberrations are also proposed: for example, a method disclosed in Japanese Patent Application No. 10-321685 (first literature) and a method disclosed in Extended Abstracts (the 46th Meeting) of the Japan Society of Applied Physics and Related Societies, 28-YB-10, page 739 (second literature). The first literature discloses a technology of measuring the lens aberration by evaluating the symmetry of a light intensity peak, that is, a side peak which is generated when a pattern is formed by using a halftone phase shift mask and which does not become the pattern. The second literature discloses a technology of measuring the lens aberration by measuring the amount of a misalignment which varies in correspondence to the pitch of a pattern actually transferred to a photoresist film. The values of the lens aberration obtained by these methods are used in the technical philosophy of the present invention.

Figure 15:
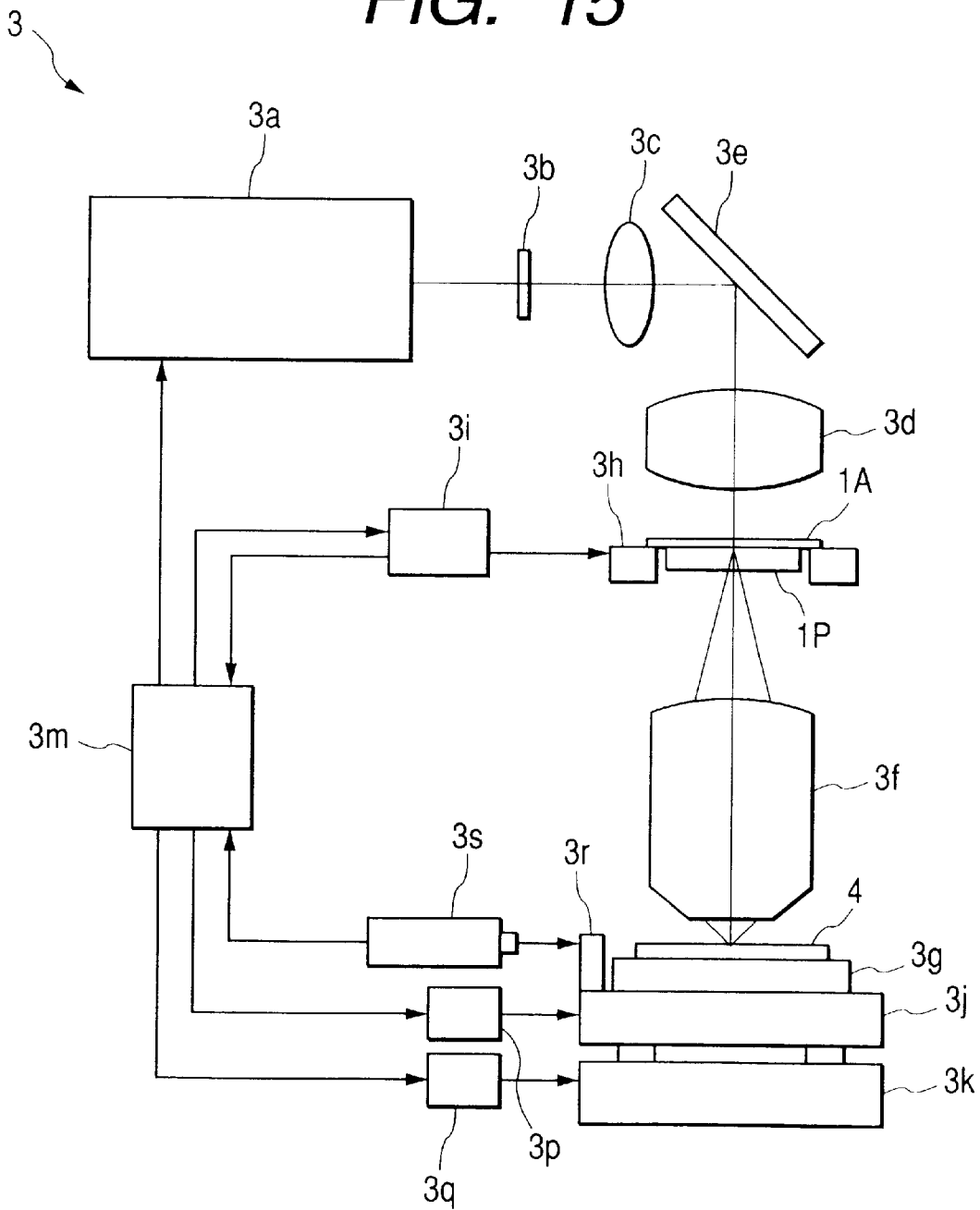
FIG. 15 is an illustration of one example of a demagnification projection aligner used in one preferred embodiment in accordance with the present invention.

Next, one example of a demagnification projection aligner used in the present preferred embodiment 1 will be shown in FIG. 15. The demagnification projection aligner 3 has, for example, a demagnification rate of ¼, KrF excimer laser (wavelength=0.248 μm) as exposure light, a coherency σ of not more than 0.3, preferably, not more than 0.1, a numerical aperture NA of a projection lens of 0.68.

The exposure light emitted by the exposure light source 3*a* of the demagnification projection aligner 3 is applied to a phase shift mask 1A after the pattern correction via a filament lens 3*b*, condenser lenses 3*c*, 3*d*, and a mirror 3*e*. The phase shift mask 1A is provided with a pellicle 1P, if necessary. The pellicle 1P is a member for preventing a transfer defect caused by foreign particles sticking to the phase shift mask 1A. A pattern described on the phase mask 1A is transferred to a photoresist mask applied to the main surface of a semiconductor wafer 4 on a sample table 3*g* via a projection lens 3*f*. The phase shift mask 1A is placed on a mask stage 3*h* in a state in which the center of the phase shift mask 1A is correctly aligned with the optical axis of the projection lens 3*f* in a relative plan position. The mask stage 3*h* is placed in a state in which it can move in the direction horizontal to and in the direction vertical to the main surface of the phase shift mask 1A. The movement of the mask stage 3*h* is controlled by a mask position control unit 3*i*. Also, a photoresist film is applied to the main surface of the semiconductor wafer 4. The sample table 3*g* is placed on a Z stage 3*j*. The Z stage 3*j* is placed on an X-Y stage 3*k* in a state in which it can move in the direction of the optical axis of the projection lens 3*f* (in the up and down direction in FIG. 15). The X-Y stage 3*k* is placed in a state in which it can move in the direction horizontal to the main surface of the semiconductor wafer 4 and in the directions of X and Y which cross each other. The Z stage 3j and the X-Y stage 3k are driven by driving units 3p, 3q according to the control commands from a main control system 3m. Accordingly, the semiconductor wafer 4 can be moved to a desired exposure position. The plan position of the semiconductor wafer 4 is correctly monitored as the position of a mirror 3r fixed to the Z stage 3j with a laser length measuring unit 3s.

Preferred Embodiment 2

In the preferred embodiment 2 will be described a case where the technical philosophy of the present invention is applied to, for example, a line pattern.

Figure 16A:
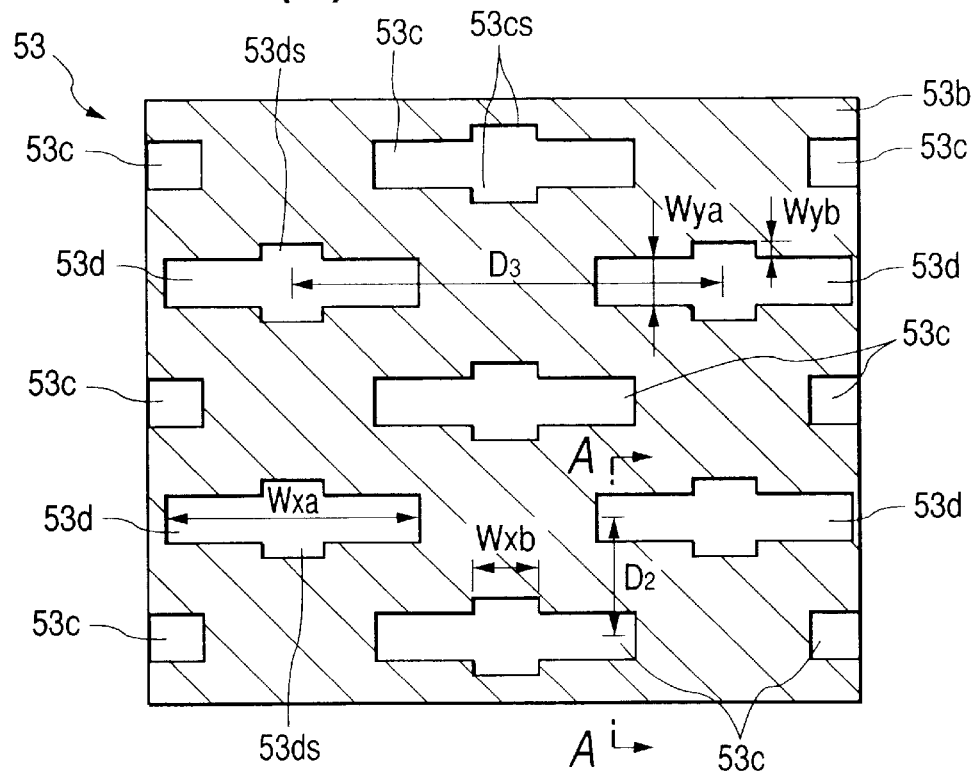
FIG. 16(a) is a plan view of an essential portion of a photomask for transferring a line pattern before the application of the present invention (before a correction), and (b) is a cross-sectional view taken on a line A—A in FIG. 16(a), and (c) is an enlarged plan view of a pattern in FIG. 16(a)
Figure 16B:
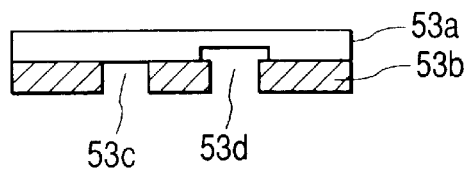
Figure 16C:
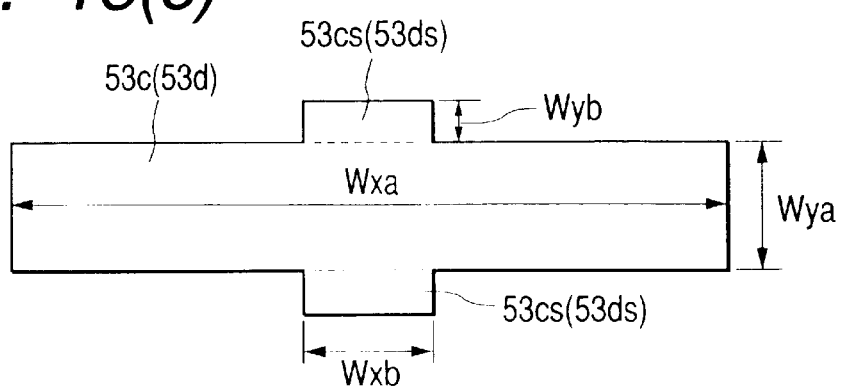

FIG. 16(a) is a plan view of an essential portion of a phase shift mask 53 for transferring a line pattern before the application of the present invention (before the pattern correction), and FIG. 16(b) is a cross-sectional view taken on a line A—A in FIG. 16(a), and FIG. 16(c) is an enlarged plan view of a pattern in FIG. 16(a). The phase shift mask 53 is, for example, a mask for forming an active region in a memory cell of a dynamic random access memory (hereinafter referred to as DRAM). A reference character 53a designates a mask substrate, a reference character 53b designates a light-shielding film, reference characters 53c, 53d designate patterns, and reference characters 53cs, 53ds designate subpatterns. The mask substrate 53a and the light-shielding film 53b are identical to the above-mentioned mask substrate 52a and the light-shielding film 52b. The patterns 53c, 53d are the light transmitting regions which are apertures made in the parts of the light-shielding film 53b in a shape like, for example, a belt in a plan view, and at one pattern 53d is disposed a phase shifter such that it generates a phase shift of 180 degrees between the lights passing through the patterns 53c, 53d. This phase shifter is also identical to the phase shifter described in the preferred embodiment 1. The patterns 53c, 53d are arranged alternately in the up and down direction in FIG. 16(a) (in the direction of width of the patterns 53c, 53d). Also, the patterns 53c, 53d neighboring in the up and down direction in FIG. 16(a) are arranged in a state in which the coordinates of the centers of the patterns 53c, 53d are shifted in the lateral direction of the patterns 53c, 53d such that they are positioned in a slanting direction to each other in a plan position. At the centers of both the long sides of each of the patterns 53c, 53d are arranged sub-patterns 53cs, 53ds to widen the center position of each of the patterns 53c, 53d. The subpatterns 53cs, 53ds are so-called OPC pattern to inhibit or prevent the constriction of the center portion of the transferred pattern.

The design size Wxa in the direction of length of the patterns 53c, 53d and the design size Wya in the direction of width of the patterns 53c, 53d are as follows: Wxa=1.00 $\mu$m (if the magnification of the projection aligner optical system is ⅕, Wxa=5.0 $\mu$m on the mask) and Wya=0.18 $\mu$m (if the magnification of the projection aligner optical system is ⅕, Wxa=0.9 $\mu$m on the mask). The distance D2 between the centers of the patterns 53c, 53d neighboring in the up and down direction in FIG. 16(a) is, for example, 0.36 $\mu$m (if the magnification of the projection aligner optical system is ⅕, Wxa=1.80 $\mu$m on the mask). Also, the distance D3 between the centers of the patterns 53c, 53c (or patterns 53d, 53d) neighboring in the lateral direction in FIG. 16(a) is, for example, 1.44 $\mu$m (if the magnification of the projection aligner optical system is ⅕, Wxa=7.20 $\mu$m on the mask). Also, the design sizes Wxb, Wyb of the sub-patterns 53cs, 53ds are, for example, 0.16 $\mu$m and 0.02 $\mu$m (if the magnification of the projection aligner optical system is ⅕, Wxb=0.8 $\mu$m, Wyb=0.10 $\mu$m on the mask).

Figure 17A:
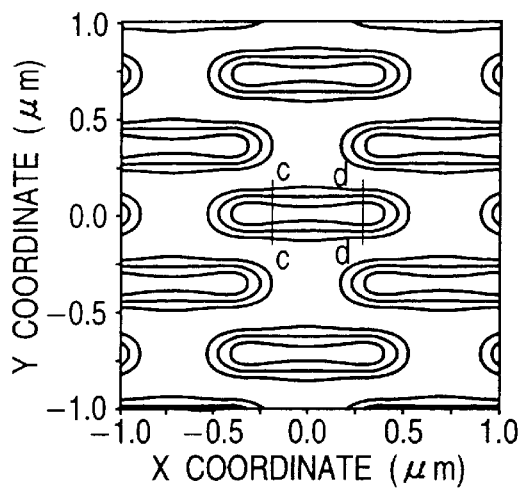
FIG. 17(a) is an illustration showing a light intensity distribution of a transferred pattern obtained by using a photomask in the case where there is no lens aberration and (b) is an illustration showing a light intensity distribution of a transferred pattern obtained by using a photomask in the case where there is a lens aberration.

FIGS. 17(a), (b) show the light intensity distribution of the transferred pattern obtained by using the above-mentioned phase shift mask 53. Here, to transfer the pattern, for example, a stepper having an exposure light wavelength $\lambda$ of 0.248 $\mu$m and a numerical number of a lens NA of 0.60 was used.

Figure 17B:
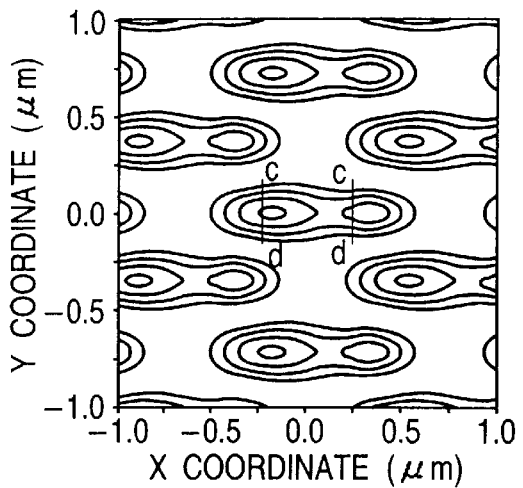

FIG. 17(a) shows a plane light intensity distribution in the case where a lens has no aberration and FIG. 17(b) shows a plane light intensity distribution in the case where a lens has an aberration. As shown in FIG. 17(a), in the case where the lens has no aberration, a pattern abnormality is not observed and the size between c and c is almost equal to the size between d and d. On the other hand, as shown in FIG. 17(b), in the case where the lens has the aberration, the shape of the pattern is deformed because of the aberration to produce a big difference between the size between c and c and the size between d and d.

Figure 18:
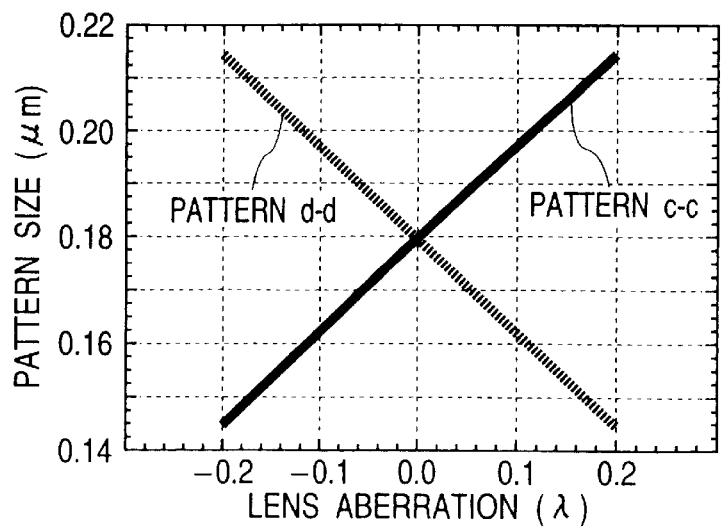
FIG. 18 is an illustration showing variations in the size between c and c and in the size between d and d to the lens aberration.

FIG. 18 shows variations in the size between c and c and in the size between d and d versus the lens aberration, and a vertical axis designates a pattern size and a lateral axis designates a lens aberration. Also, a solid line designates the size between c and c and a broken line designates the size between d and d. As shown in FIG. 18, as the lens aberration increases, the difference in the pattern size increases. In the stepper used in the present preferred embodiment 2, the Trefoil aberration (a term of $\rho^3 \times \cos 3\theta$), one of the lens aberrations, was about $0.05\lambda$. In this manner, in the case where the lens has the aberration, the size between c and c was, for example, 0.189 $\mu$m and the size between d and d was 0.1713 $\mu$m. Therefore, a difference in the size in one pattern (the difference between the size between c and c and the size between d and d) was, for example, 17.7 nm.

Figure 19A:
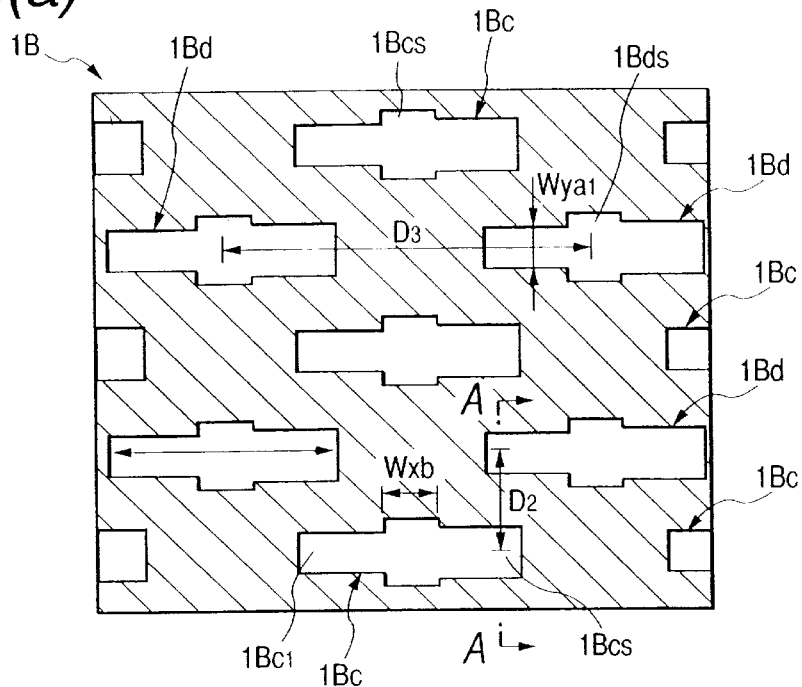
FIG. 19(a) is a plan view of an essential portion of a photomask for transferring a line pattern before the application of the present invention (before the correction), and (b) is a cross-sectional view taken on a line A—A in FIG. 19(a), and (c) is an enlarged plan view of a pattern in FIG. 19(a), and (d) and (e) are cross-sectional views of an essential portion of a modified example of a photomask.
Figure 19B:
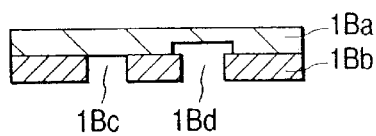
Figure 19C:
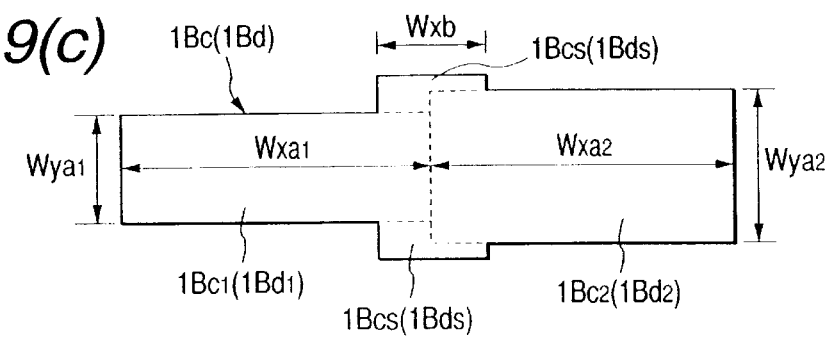
Figure 19D:
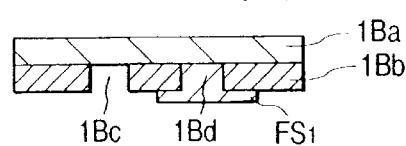
Figure 19E:
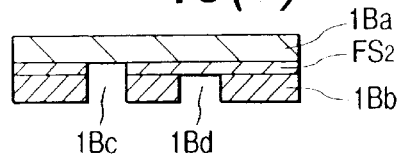

For this reason, in the present preferred embodiment 2, for the purpose of reducing the difference in the pattern size caused by the lens aberration, the pattern is corrected as is the case with the above-mentioned preferred embodiment 1. FIG. 19(a) is a plan view of the essential portion of the phase shift mask 1B for transferring the line pattern after correction, and FIG. 19(b) is a cross-sectional view taken on a line A—A in FIG. 19(a), and FIG. 19(c) is an enlarged plan view of a pattern in FIG. 19(a), and FIGS. 19(d) and (e) are cross-sectional views of the essential portion of a modification of a phase shift mask. A reference character 1Ba designates a mask substrate, and a reference character 1Bb designates a light-shielding film, and reference characters 1Bc, 1Bd designate patterns, and reference characters 1Bcs, 1Bds designate sub-patterns. The mask substrate 1Ba and the light-shielding film 1Bb are identical to the above-mentioned mask substrate 53a and the light-shielding film 53b. The patterns 1Bc and 1Bd are patterns corresponding to the above-mentioned patterns 53c, 53d and are light transmitting regions which are apertures made in the parts of the light-shielding film 1Bb in a shape like, for example, a belt in a plan view. On the other hand, a phase shifter is arranged at the pattern 1Bd such that it produces, for example, a phase shift of 180 degrees between lights passing through the patterns 1Bc and 1Bd. The phase shifter used in this case is also identical to that used in the preferred embodiment 1. The arrangement of the patterns 1Bc and 1Bd is identical to that of the above-mentioned patterns 53c and 53d, and hence the description thereof will be omitted. Also, the arrangement and the function of the sub-patterns 1Bcs, and 1Bds are identical to those of the above-mentioned sub-patterns 53cs and 53ds and hence the description thereof will be omitted. The phase shift mask 1B after the correction is different from the above-mentioned phase shift mask 53 in that the pattern 1Bc (1Bd) is divided into two patterns 1Bc1, 1Bc2 (1Bd1, 1Bd2) at the center and that one pattern 1Bc2 (1Bd2) is wider than the other pattern 1Bc1 (1Bd1). As a result of correcting the pattern in consideration of the aberration of the lens, the design sizes of a light transmitting region of the pattern 1Bc (1Bd) were made as follows: Wxa1=Wxa2=0.50 µm (if the magnification of the projection aligner optical system is ⅕, Wxa1=Wxa2=2.00 µm on the mask) and Wya1=0.17 µm, Wya2=0.19 µm (if the magnification of the projection aligner optical system is ⅕, Wya1=0.85 µm, Wya2=0.95 µm on the mask). FIG. 19(d) shows one example of a phase shift in the case in which the phase shifter in FIGS. 19(a), (b) is constituted by a transparent film FS1. The transparent film FS1 is made of, for example, a silicon oxide film (SOG film) or the like and is formed to cover a part of the light-shielding film 1Bb. The reversal of the phase of the transmitted light is adjusted by the thickness of the transparent film FS1. Also, FIG. 19(e) shows one example of the phase shift in the case in which the phase shifter in FIGS. 19(a), (b) is constituted by a transparent film FS2. The material and the thickness of the transparent film FS2 are identical to those of the transparent film FS1. Here, the transparent film FS2 is interposed between the light-shielding film 1Bb and the mask substrate 1Ba. This is because the depositing of the transparent FS2 on the flat mask substrate 1Ba can make the obverse surface of the transparent film FS2 more flat and can relatively easily form the thickness of the transparent film FS2 film with high accuracy. For example, in the case where the transparent film FS2 exposed from the light-shielding film 1Ba is etched away, the depth of scraping can be set relatively easily with high accuracy by using the mask substrate 1Ba as an etching stopper.

Figure 20A:
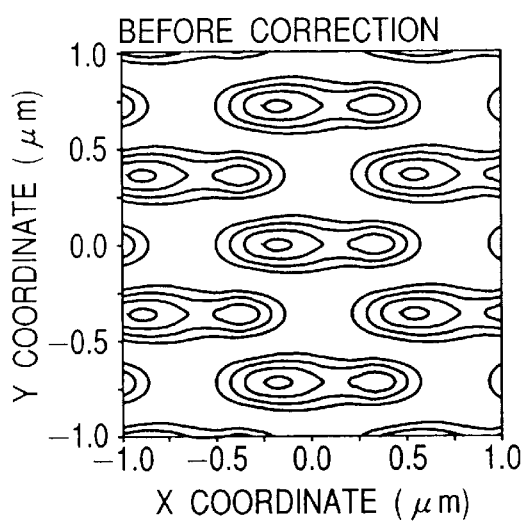
FIG. 20(a) is an illustration showing a light intensity distribution using a photomask before the correction and (b) is an illustration showing a light intensity distribution using a photomask after a correction.
Figure 20B:
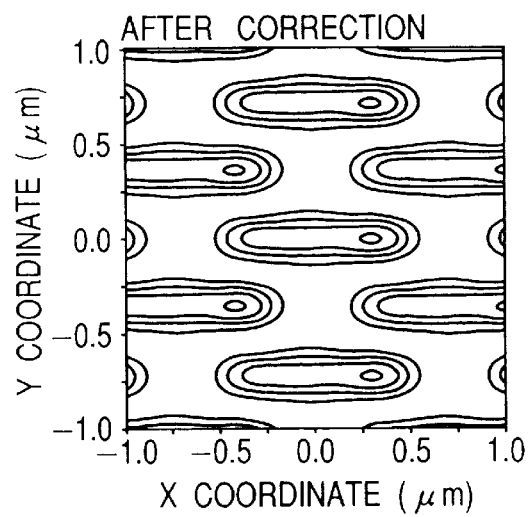
Figure 21:
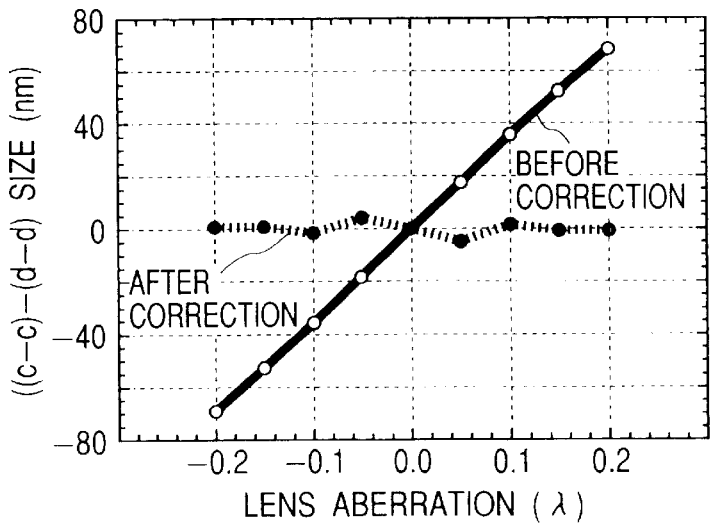
FIG. 21 is an illustration showing a relationship between the lens aberration and variations in the pattern size before and after a correction.

Next, the light intensity distributions using the phase shift mask before and after the correction will be shown in FIGS. 20(a), (b). Here, a stepper having an exposure light wavelength λ of 0.248 µm and a numerical aperture of a lens NA of 0.60 was used for transferring the pattern. FIGS. 20(a), (b) show plan light intensity distributions in the case where the Trefoil aberration (a term of $\rho^3 \times \cos 3\theta$), one of the lens aberrations, is about 0.05λ. FIG. 20(a) shows the light intensity distribution before the pattern correction and FIG. 20(b) shows the light intensity distribution after the pattern correction. There is a big difference between FIG. 20(a) and FIG. 20(b) and an almost ideal shape could be produced by the effect of the pattern correction. Also, a relationship between the lens aberration and the variations in the pattern size before and after the pattern correction will be shown in FIG. 21. Although the size difference is not completely reduced to zero because of the layout and the minimum grid when the mask is formed, the maximum size difference which was about 70 nm with respect to a target before the pattern correction could be reduced to about 4.0 nm or less after the pattern correction.

While the Trefoil aberration (Zernike coefficient of $\rho^3 \times \cos 3\theta$ or $\rho^3 \times \sin 3\theta$) has been described as the aberration in the present preferred embodiment 2, it is not intended to limit the kind of aberration to be corrected to the Trefoil aberration, but various kinds of aberrations can be corrected. For example, the technical philosophy of the present invention can be applied to the coma aberration described in the above-mentioned preferred embodiment 1 to solve the problem of the coma aberration. Also, as is the case with the above preferred embodiment 1, it is not necessary to correct all the lens aberrations and only the correction of the effect of the desired lens aberration can produce a sufficient effect.

Preferred Embodiment 3

In the present preferred embodiment 3 will be described an example in which the technical philosophy of the present invention is applied to, for example, the formation of the connection hole pattern of a DRAM.

Figure 22:
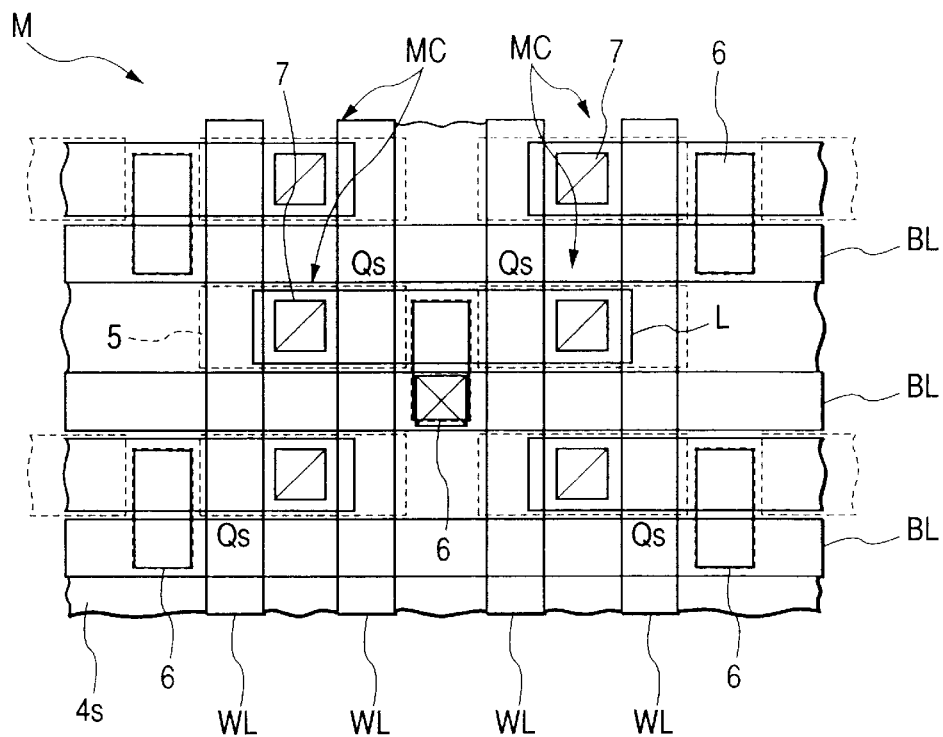
FIG. 22 is a plan view of an essential portion of a semiconductor substrate of a memory cell array M of a semiconductor integrated circuit device.

FIG. 22 shows a plan view of an essential portion of a semiconductor substrate 4s in a memory cell array M of a DRAM (semiconductor integrated circuit device). The semiconductor substrate 4s is made of, for example, a silicon single crystal and is cut away as a semiconductor chip from the above-mentioned semiconductor wafer 4. In the memory cell array M are arranged a plurality of memory cells MC. Each memory cell MC is arranged in the vicinity of a point of intersection of each of a plurality of word lines WL extending in the up and down direction and each of a plurality of bit lines BL crossing the plurality of word lines WL in FIG. 22 and is constituted by a memory cell selecting MIS/FET (Metal Insulator Semiconductor/Field Effect Transistor) Qs and a capacitor for storing information which is connected in series to the MIS/FET. The memory cell selecting MIS/FETQs is made of, for example, an n-channel type MISFET and its gate electrode is constituted by a part of the word line WL. Also, for example, the capacitor for storing information adopts a crown-type capacitor. The bottom electrode 5 of the capacitor for storing information is mounted over (on the upper layer of) the word line WL and the bit line BL (referred to as so-called capacitor over bit line, COB). An active region L is arranged between the neighboring bit lines BL on the main surface of the semiconductor substrate 4s. A region where the word lines WL overlap in the active region L becomes the channel region of the memory cell selecting MIS/FETQs and a region where the word lines WL do not overlap in the active region L becomes the source/drain region of the memory cell selecting MIS/FETQs. A plug 6 is electrically connected to the source/drain region arranged in the center of the active region L. The plug 6 is elongated in the up and down direction in FIG. 22 such that it overlaps the bit line BL in the plane. A portion of the plug 6 where it overlaps the bit line BL in the plane is insulated from the semiconductor 4s side but is electrically connected to the bit line BL. Also, a contact hole (connection hole) 7 is formed in the source/drain region arranged near both the ends of the active region L and the bottom electrode 5 of the capacitor for storing information is electrically connected to the source/drain region through a conducting part in the contact hole.

Figure 23A:
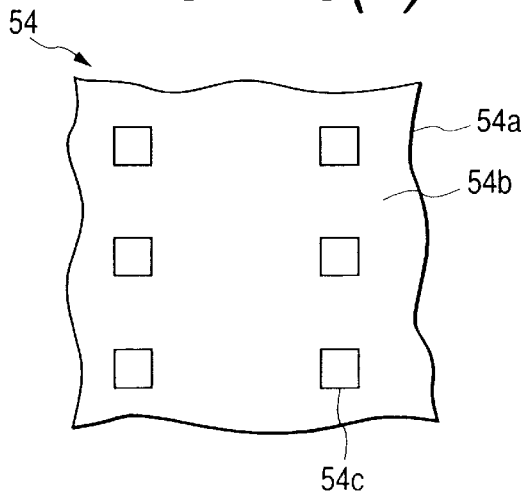
FIG. 23(a) is a plan view of an essential portion of a photomask before the correction and (b) is a plan view of an essential portion of a photomask after the correction in accordance with the technical philosophy of the present invention.

Here, the shape of a photomask used for forming the contact hole 7 will be shown in FIG. 23. FIG. 23(a) is a plan view of an essential portion of a photomask 54 before the pattern correction and (b) is a plan view of an essential portion of a photomask 1C which is corrected according to the technical philosophy of the present invention.

Figure 23B:
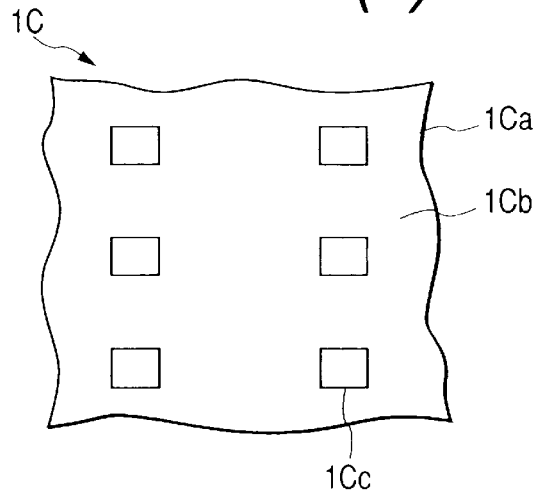

Mask substrates 54a, 1Ca are identical to the above-mentioned mask substrates 53a, 1Ba. Light-shielding films 54b, 1Cb are identical to the above light-shielding films 53b, 1Bb. In the present preferred embodiment 3, as shown in FIG. 23, a pattern 54c for forming the contact hole 7 in FIG. 23(a) was made into the pattern 1Cc for forming the contact hole 7 in FIG. 23(b) by correction in consideration of a pattern deformation caused by the lens aberration. Although each of the patterns 54c, 1Cc is formed in, for example, a rectangle in a plan view, the lateral size of 1Cc after the pattern correction in FIG. 23 is longer than the lateral size of 54c before the pattern correction in FIG. 23. This could inhibit or prevent the deformation of the transferred pattern for forming the contact hole 7 caused by the lens aberration. For this reason, the deterioration of a margin or the short circuit between the neighboring patterns which are caused by the deformation of the pattern could be prevented, whereby the yield and the reliability of the DRAM could be improved.

While the invention made by the present inventor has been specifically described based on the preferred embodiments, needless to say, it is not intended to limit the present invention to the above-mentioned preferred embodiments but the present invention may be further modified within the scope and spirit of the invention defined by the appended claims.

For example, when a predetermined pattern is described on a photomask by using the electron beam lithography system to the like, the correction according to the present invention can be also made in the electron beam lithography system. This increases data only when the pattern is described and does not increase data when the data is transmitted.

Also, while a case in which the KrF excimer laser is used as the exposure light has been described in the above-mentioned preferred embodiments 1 to 3, the exposure light is not limited to the KrF excimer laser, but other kinds of light sources can be used. For example, it is also recommended that excimer laser light using ArF, $F_2$, vacuum ultraviolet exposure light, or ultraviolet rays such as i-rays ($\lambda$=365 nm) or g-rays ($\lambda$=436 nm) be used.

Also, it is recommended to take the following processes: performing an exposure processing by using a photomask formed by making a correction according to the present invention; correcting the pattern data of the photomask based on the transferred pattern obtained; and manufacturing the photomask based on the corrected pattern data. This makes it possible to find a pattern abnormality caused by the above-mentioned disturbances and to correct the pattern so as to eliminate the pattern abnormality.

While the invention made by the present inventor has been described mainly with reference to the case where the invention is applied to the DRAM which is one application field and the background of the invention, the present invention is not limited to the DRAM but the present invention can be applied to, for example, a semiconductor integrated circuit device having the other memory circuit such as a SRAM (static random access memory) or a flash memory (EEPROM: electric erasable programmable read only memory), a semiconductor integrated circuit device having a logic circuit such as a microprocessor or the like, or a semiconductor integrated circuit device having the above memory circuit and the logic circuit on the same semiconductor substrate.

Also, while the invention made by the present inventor has been described mainly with reference to the case where the invention is applied to the manufacturing method of the semiconductor integrated circuit device which is one application field and the background of the invention, the present invention is not limited to that manufacturing method of the semiconductor integrated circuit device, but the present invention can be applied to a fine pattern forming method, for example, a manufacturing method of a liquid crystal display substrate, a magnetic head or the like.

The effects produced by the typical inventions of the present invention disclosed in the present specification will be briefly described in the following.

(1) According to one preferred embodiment of the present application, an ideal transferred pattern close to a state of no aberration can be produced irrespective of the magnitude of the lens aberration of a pattern exposure device. Therefore, it is possible to inhibit or prevent a pattern abnormality such as the deformation or misalignment of the pattern.

(2) According to one preferred embodiment of the present application, a more ideal pattern can be formed in the whole area of an exposed region by correcting a pattern in accordance with the distribution of aberration in the exposed region.

(3) According to one preferred embodiment of the present application, it is possible to correct a pattern by suitable values depending on the positions in the whole area in an exposed region.

(4) According to one preferred embodiment of the present application, it is possible to reduce processes of actually manufacturing or measuring a photomask for inspection or like because a pattern correction is made on a computer.

(5) It is possible to substantially reduce the manufacturing time of the photomask because of the above (4).

(6) Since the manufacturing process of the photomask for inspection can be eliminated because of the above (4), it is possible to eliminate the waste of material used for manufacturing the photomask.

(7) According to one preferred embodiment of the present application, it is possible to prevent the elements of a pattern abnormality caused by the disturbances such as effects of the performance of a resist film, a measurement environment or the completeness of a mask from getting into the elements of an correction by calculating a light intensity at a step of correction and, hence, the pattern abnormality caused by the lens aberration can be corrected more correctly. Therefore, it is possible to improve the correction accuracy of the pattern of the mask.

(8) According to one preferred embodiment of the present application, it is possible to prevent a reduction in the overlay margin of a pattern and to realize a higher-density pattern arrangement and to manufacture a semiconductor integrated circuit device by using an optical lithography.

(9) According to one preferred embodiment of the present application, it is possible to inhibit or prevent a pattern abnormality and hence it is possible to inhibit or prevent a change in characteristics of a semiconductor integrated circuit device. This can improve the yield or reliability of the semiconductor integrated circuit device.

(10) According to one preferred embodiment of the present application, it is possible to reduce the manufacturing time of a semiconductor integrated circuit device and to simplify the manufacturing process thereof.

(11) According to one preferred embodiment of the present application, it is possible to reduce the manufacturing cost of a semiconductor integrated circuit device.

What is claimed is:

1. A method of manufacturing a semiconductor integrated circuit device, the method comprising the steps of:

(a) automatically correcting pattern data of a mask based on wavefront aberration data of a lens of a pattern exposure device or aberration data equivalent to the same;

(b) manufacturing the mask based on the corrected pattern data; and (c) transferring a pattern of the mask manufactured by the step (b) to a semiconductor wafer by using the pattern exposure device.

2. A method of manufacturing a semiconductor integrated circuit device as claimed in claim 1, wherein correction is made to each plane position in an exposed region.

3. A method of manufacturing a semiconductor integrated circuit device as claimed in claim 2, wherein a different correction is made according to a plane position in an exposed region.

4. A method of manufacturing a semiconductor integrated circuit device as claimed in claim 2, wherein a same correction is made to the pattern data of the mask according to the plane position in an exposed region.

5. A method of manufacturing a semiconductor integrated circuit device as claimed in claim 1, wherein a same correction is made to the pattern data of the mask according to a plane position in an exposed region.

6. A method of manufacturing a semiconductor integrated circuit device as claimed in claim 1, wherein an exposed region is divided into predetermined blocks and correction of the pattern data is made to each block according to the lens aberration corresponding to the block.

7. A method of manufacturing a semiconductor integrated circuit device as claimed in claim 1, wherein an amount of correction of the pattern data is automatically calculated from a light intensity calculation in consideration of the wavefront aberration data of a lens of the pattern exposure device or the aberration data equivalent to the same.

8. A method of manufacturing a semiconductor integrated circuit device as claimed in claim 1, wherein the step of manufacturing the mask includes a step of making a phase shifter for changing the phase of transmitted light in the mask.

9. A method of manufacturing a semiconductor integrated circuit device as claimed in claim 1, wherein an exposure light of the pattern exposure device is excimer laser light.

10. A method of manufacturing a semiconductor integrated circuit device as claimed in claim 1, wherein said pattern exposure device includes a projection optical system.

11. A method of manufacturing a semiconductor integrated circuit device, the method comprising the steps of:
(a) calculating a light intensity of a mask pattern in consideration of aberration of a lens by using wavefront aberration data of a lens of a pattern exposure device or aberration data equivalent to the same;
(b) comparing results of the light intensity calculation in step (a) with results of a light intensity calculation of the mask pattern on condition that there is no aberration of the lens;
(c) when an abnormality of a predetermined pattern of the mask exceeds an allowable range as indicated by a result of the comparison in step (b), automatically calculating a pattern correction amount to ensure that the allowable range is not exceeded, and automatically correcting data of the mask pattern according to a result of said pattern correction amount calculation;
(d) manufacturing a mask according to the mask pattern data as automatically corrected in step (c); and
(e) transferring a pattern of the mask manufactured by step (d) to a semiconductor wafer by using the pattern exposure device.

12. A method of manufacturing a semiconductor integrated circuit device as claimed in claim 11, wherein correction is made to each plane position in an exposed region.

13. A method of manufacturing a semiconductor integrated circuit device as claimed in claim 12, wherein a different correction is made according to a plane position in an exposed region.

14. A method of manufacturing a semiconductor integrated circuit device as claimed in claim 12, wherein a same correction is made to the pattern data of the mask according to the plane position in an exposed region.

15. A method of manufacturing a semiconductor integrated circuit device as claimed in claim 11, wherein a same correction is made to the pattern data of the mask according to a plane position in an exposed region.

16. A method of manufacturing a semiconductor integrated circuit device as claimed in claim 11, wherein an exposed region is divided into predetermined blocks and correction of the mask pattern data is made to each block according to the lens aberration corresponding to the block.

17. A method of manufacturing a semiconductor integrated circuit device as claimed in claim 11, wherein the step of manufacturing the mask includes a step of making a phase shifter for changing the phase of transmitted light in the mask.

18. A method of manufacturing a semiconductor integrated circuit device as claimed in claim 11, wherein an exposure light of the pattern exposure device is excimer laser light.

19. A method of manufacturing a semiconductor integrated circuit device as claimed in claim 11, wherein said pattern exposure device includes a projection optical system.

20. A method of manufacturing a mask to be used with a pattern exposure device, the method comprising the steps of:
(a) automatically correcting pattern data of the mask based on wavefront aberration data of a lens of the pattern exposure device or aberration data equivalent to the same; and
(b) manufacturing the mask based on the corrected pattern data.

21. A method of manufacturing a mask as claimed in claim 20, wherein the step (b) comprises the steps of:
(b1) depositing metal on a mask substrate;
(b2) depositing a resist film on the metal;
(b3) transferring a mask pattern to the resist film to form a resist pattern; and
(b4) removing the metal exposed from the resist pattern by using the resist pattern as an etching mask to make apertures at parts of the metal to thereby form a pattern, wherein the pattern data of the mask corrected in the step (a) is used in the step (b3).

22. A method of manufacturing a mask as claimed in claim 20, wherein correction is made to each plane position in an exposed region.

23. A method of manufacturing a mask as claimed in claim 22, wherein a different correction is made according to the plane position in an exposed region.

24. A method of manufacturing a mask as claimed in claim 22, wherein a same correction is made to the pattern data of the mask according to the plane position in an exposed region.

25. A method of manufacturing a mask as claimed in claim 20, wherein a same correction is made to the pattern data of the mask according to a plane position in an exposed region.

26. A method of manufacturing a mask as claimed in claim 20, wherein an exposed region is divided into predetermined blocks and correction of the pattern data is made to each block according to the lens aberration corresponding to each block.

27. A method of manufacturing a mask as claimed in claim 20, wherein an amount of correction of the pattern data is automatically calculated from a light intensity calculation in consideration of the wavefront aberration of the lens of the pattern exposure device or the aberration data equivalent to the same.

28. A method of manufacturing a mask as claimed in claim 20, wherein the step (b) includes providing the mask with a phase shifter for changing the phase of transmitted light.

29. A method of manufacturing a mask as claimed in claim 20, wherein said pattern data is corrected based on wavefront aberration data of a lens of a pattern exposure device including a projection optical system or aberration data equivalent to the same.

30. A method of manufacturing a semiconductor integrated circuit device, the method comprising the steps of:
(a) calculating a light intensity of a mask pattern in consideration of aberration of a lens by using wavefront aberration data of a lens of a pattern exposure device or an aberration data equivalent to the same;
(b) comparing results of the light intensity calculation in step (a) with results of a light intensity calculation of the mask pattern on condition that there is no aberration of the lens;
(c) determining whether an abnormality of a predetermined pattern of the mask exceeds an allowable range as indicated by a result of the comparison in step (b) and, if said abnormality exceeds said allowable range, automatically calculating a pattern correction amount to ensure that the allowable range is not exceeded and automatically correcting data of the mask pattern according to a result of said pattern correction amount calculation;
(d) manufacturing a mask according to the mask pattern data, including any correction made in step (c); and
(e) transferring a pattern of the mask manufactured by step (d) to a semiconductor wafer by using the pattern exposure device.

31. A method of manufacturing a semiconductor integrated circuit device as claimed in claim 30, wherein said pattern exposure device includes a projection optical system.

* * * * *